(12) United States Patent
Yamamoto et al.

(10) Patent No.: US 6,297,532 B1
(45) Date of Patent: *Oct. 2, 2001

(54) SEMICONDUCTOR DEVICE AND METHOD OF MANUFACTURING THE SAME

(75) Inventors: Fumitoshi Yamamoto; Tomohide Terashima, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1043 days.

(21) Appl. No.: 08/787,332

(22) Filed: Jan. 27, 1997

Related U.S. Application Data

(63) Continuation of application No. 08/610,515, filed on Mar. 4, 1996, now abandoned, which is a continuation of application No. 08/336,697, filed on Nov. 7, 1994, now abandoned.

(30) Foreign Application Priority Data

Nov. 8, 1993 (JP) .................................................. 5-278685

(51) Int. Cl.[7] .............................. H01L 29/78; H01L 33/00
(52) U.S. Cl. .......................................... 257/333; 257/335
(58) Field of Search ..................................... 257/333, 335

(56) References Cited

U.S. PATENT DOCUMENTS 4,362,597 * 12/1982 Fraser et al. ........................ 257/755
4,628,006 * 12/1986 Rathbun et al. ...................... 257/335
5,072,275 * 12/1991 Vora ...................................... 257/755
5,198,683 * 3/1993 Sivon .................................... 257/333
5,233,181 * 8/1993 Kvansnick et al. .................. 257/333
5,254,497 10/1993 Liu .

FOREIGN PATENT DOCUMENTS

| 43 00355 A1 | 7/1993 | (DE) . |
| 63-293876 | * 11/1988 | (JP) . |
| 64-77941 | 3/1989 | (JP) . |
| 6-077208 | 3/1994 | (JP) . |

* cited by examiner

Primary Examiner—Stephen D. Meier
(74) Attorney, Agent, or Firm—McDermott, Will & Emery

(57) ABSTRACT

The present invention aims to provide a semiconductor device in which a satisfactory breakdown voltage can be obtained without increasing its chip size, and a method of manufacturing the same. A first electrode layer and a second electrode layer are formed. An inorganic type silicon oxide film is formed so as to cover first and second electrodes. An organic type silicon oxide film is formed on a surface of inorganic type silicon oxide film above a portion of a surface of first electrode layer. At a region of inorganic type silicon oxide film where organic type silicon oxide film is not formed, a through hole is formed, exposing a portion of a surface of second electrode layer. An interconnection layer is formed so as to be in contact with second electrode layer via through hole and opposing first electrode layer with inorganic and organic type silicon oxide films therebetween.

8 Claims, 19 Drawing Sheets

FILM THICKNESS OF OXIDE FILM (Å)

SEMICONDUCTOR DEVICE AND METHOD OF MANUFACTURING THE SAME

This application is a continuation of application Ser. No. 08/610,515 filed Mar. 4, 1996 now abandoned which is a continuation of application Ser. No. 08/336,697 filed Nov. 7, 1994 now abandoned.

BACKGROUND OF THE INVENTION

1. Field of the Invention

The present invention relates to a semiconductor device and a method of manufacturing the same, and particularly to a semiconductor device which requires a high breakdown voltage, and a method of manufacturing the same.

2. Description of the Background Art

A semiconductor device of a type having a high breakdown voltage is characterized in that it has a high switching rate, operates safely over a large range, readily allows parallel operations, and so on. For these reasons, in recent years, attention is being paid to such semiconductor devices of the type having high breakdown voltages as well as to bipolar transistors and thyristors, as switching devices for power and the like.

As a conventional semiconductor device, a diode of a type having a high breakdown voltage will be described in the following.

FIG. 18A is a cross sectional view schematically showing the structure of the conventional semiconductor device. FIG. 18B is a schematic plan view taken from the direction of arrow $A_2$ in FIG. 18A.

Referring to FIGS. 18A and 18B, an $n^-$ epitaxial layer 3 and a $p^+$ diffused region 5 are formed on a surface of a p type semiconductor substrate 1. This $p^+$ diffused region 5 forms an annular structure surrounding $n^-$ epitaxial layer 3, when viewed two dimensionally.

An $n^+$ diffused region 7 is formed at a surface of $n^-$ epitaxial layer 3.

On surfaces of $n^-$ epitaxial layer 3 and $p^+$ diffused region 5, a silicon oxide film 9 is formed. A contact hole 9a exposing a portion of the surface of $p^+$ diffused region 5, and a contact hole 9b exposing a portion of the surface of $n^+$ diffused region 7, are formed at this silicon oxide film 9.

A first electrode layer 11 is formed to be in contact with $p^+$ diffused region 5 through contact hole 9a. This first electrode layer 11 is formed to have an annular configuration along the contour of $p^+$ diffused region 5 when viewed two dimensionally. Also, a second electrode 13 is formed to be in contact with $n^+$ diffused region 7 through contact hole 9b.

An interlayer insulating film 401 is formed, covering first and second electrode layers 11 and 13. This interlayer insulating film 401 consists of a single layer of silicon oxide film, and is formed to have an approximately uniform film thickness $T_1$. A thorough hole 401a is formed in interlayer insulating film 401, reaching second electrode layer 13. This through hole 401a includes a hole 401b opened by isotropical etching and a hole 401c formed by anisotropical etching. An interconnection layer 19 is formed to be in contact with second electrode layer 13 through this through hole 401a, being spaced apart from first electrode layer 11 with interlayer insulating film 401 therebetween.

In addition, $n^+$ diffused region 7 is formed by implantation of arsenic and $p^+$ diffused region 5 is formed by implantation of boron.

Here, $n^-$ means that the amount of n type impurity implanted is relatively small, and $n^+$ and $p^+$ means that the amount of n type and p type impurities implanted respectively is relatively large.

A method of manufacturing the conventional semiconductor device will now be described.

FIGS. 19 to 25 are schematic cross sections illustrating the method of manufacturing the conventional semiconductor device, in the order of the steps which are to be performed. Referring first to FIG. 19, $n^-$ epitaxial layer 3 is formed on the surface of p type semiconductor substrate 1. On the surface of this $n^-$ epitaxial layer 3, a thin silicon oxide film (not shown) is formed, which is patterned to a desired shape. Using this thin silicon oxide film as a mask, deposition of boron (B) is performed so that boron is diffused within $n^-$ epitaxial layer 3. Thus, $p^+$ diffused region 5 is formed, surrounding $n^-$ epitaxial layer 3 in an annular configuration. The thin silicon oxide film is then removed.

Referring to FIG. 20, a thin silicon oxide film 421 is formed on the surface of n epitaxial layer 3 in which $p^+$ diffused region 5 has been formed. This thin silicon oxide film 421 is patterned by photolithography and etching to obtain a predetermined shape. Using this patterned silicon oxide film 421 as a mask, an n type impurity is implanted into $n^-$ epitaxial layer 3. By diffusion and activation of this n type impurity, $n^+$ diffused layer 7 is formed at the surface of $n^-$ epitaxial layer 3. Silicon oxide film 421 is then removed.

Referring to FIG. 21, silicon oxide film 9 is formed on the surfaces of $n^-$ epitaxial layer 3 and $p^+$ diffused region 5. A photoresist 423a is applied on the entire surface of this silicon oxide film 9, and then is subjected to exposure and development. In this way, resist pattern 423a having a hole pattern above $p^+$ diffused region 5 and above $n^+$ diffused region 7 is formed. Using this resist pattern 423a as a mask, silicon oxide film 9 is etched anisotropically, thereby forming contact holes 9a and 9b. From contact hole 9a, a portion of the surface of $p^+$ diffused region 5 is exposed. A portion of the surface of $n^+$ diffused region 7 is exposed through contact hole 9b. Thereafter, resist pattern 423a is removed.

Referring to FIG. 22, an AlSi (Aluminum Silicon) film is formed entirely on the surface of silicon oxide film 9 by sputtering. Then the Alsi film is patterned to a desired shape by photolithography and etching. In this way, first electrode layer 11 is formed to be in contact with $p^+$ diffused layer 5 through contact hole 9a and would present an annular configuration when viewed two dimensionally. At the same time, second electrode layer 13 is also formed, being in contact with $n^+$ diffused region 7 through contact hole 9b.

Referring to FIG. 23, interlayer insulating film 401 consisting of a single layer of thick silicon film is formed entirely on the surface of silicon oxide film 9 by, for example, plasma such that it covers first and second electrode layers 11 and 13 with an approximately uniform film thickness.

Referring to FIG. 24, photoresist 423b is applied on an entire surface of interlayer insulating film 401, and then is subjected to exposure and development. In this way, resist pattern 423b having a hole pattern above third electrode layer 13 is formed. Using this resist pattern 423b as a mask, an isotropic etching is performed on interlayer insulating film 401. Thus, the surface of interlayer insulating film 401 which exposes itself at the bottom portion of the hole pattern is etched isotropically, and hole 401b is formed.

Thereafter, anisotropic etching is performed until the surface of second electrode layer 13 is exposed, still using resist pattern 423b as a mask. This etching leads to the formation of second hole 401c at the bottom portion of first hole 401b. These first and second holes 401b and 401c constitute through hole 401a. Resist pattern 423b is then removed.

Referring to FIG. 25, an AlSi (Aluminum Silicon) film 19 is formed entirely over the surface of first interlayer insulating film 401 by sputtering. This AlSi film 19 is patterned by photolithography and etching. This patterning leads to the formation of interconnection layer 19 which comes into contact with second electrode layer 13 via through hole 401a and is opposed to first electrode layer 11 with interlayer insulating film 401 therebetween.

In general, an industrial power supply line may be an alternating current line of either 200V or 400V. The 200V alternating current line is mainly employed in Japan, and the 400V alternately current line is mainly employed in Europe. When rectified, this alternating current of 200V becomes direct current of 300V, and the alternating current of 400V becomes direct current of 600V.

In view of the above, driving an IC (Integrated Circuit) by a power supply with an alternating current 200V power supply involves a breakdown voltage of 600V or more in direct current for the IC as a whole, considering that surge voltage or the like would be applied. For a similar reason, an alternating current 400V power supply requires a breakdown voltage of 1200V or more for the whole IC.

In an IC employing an alternating current 400C power supply, there is a region in the IC where voltage varies in the range of 0 to 1200V. Accordingly, an interconnection which is lead out from this region would similarly have a potential of 0 to 1200V. Thus, at the portion where an interconnection of level 0V and an interconnection which would experience a rise in potential up to 1200V are crossed, the interconnection insulating film providing insulation between the two interconnections will require breakdown voltage of at least 1200V.

Thus, considering the differences among the standards in various countries, the breakdown voltage required for the interlayer insulating film which provides insulation between the interconnection layers would be very high.

Accordingly, film thickness $T_1$ of interlayer insulating film 401 have to be increased at the region where interconnection layer 19 and first electrode layer 11 are opposite to each other, as shown in FIG. 18A. In particular, film thickness $T_1$ of interlayer insulating film 401 must be no less than 2 $\mu$m.

In the conventional semiconductor device, however, the entire interlayer insulating film 401 is formed to have a practically uniform film thickness. Thus, there has been a problem that the increase in the film thickness of interlayer insulating film 401 leads to the increase of chip size, as will be explained in detail in the following.

Referring mainly to FIG. 18A, in order to connect interconnection layer 19 to second electrode layer 13, it is generally necessary to provide through hole 401a in interlayer insulating film 401. When film thickness T, of interlayer insulating film 401 is increased, the depth of the through hole is also increased. Accordingly, on the assumption that the through hole is formed by anisotropic etching only as shown in FIG. 26, the aspect ratio (depth/opening width) of a through hole 401d is increased. The increase of the aspect ratio degrades the step coverage of interconnection layer 19 formed within through hole 401d. Especially when interconnection layer 19 is formed by sputtering, there is a possibility of disconnection of the interconnection layer 19 at the bottom portion of through hole 401d (that is, at region $R_1$), since sputtering is poor at step coverage.

A method of present this disconnection of the film has been known in which interlayer insulating film 401 is etched at first isotropically and then anisotropically, as shown in FIG. 24.

According to this method, sidewall of hole 401b formed by isotropic etching would be smooth. Thus, the step coverage of interconnection layer 19 at this sidewall portion of hole 401b will be satisfactory.

In addition hole 401c formed by anisotropic etching comes to have a depth $T_2$ made smaller by the amount corresponding to the depth of the isotropic etching performed. Accordingly, the aspect ratio of hole 401c is made smaller and the step coverage of interconnection layer 19 would be satisfactory even when it is formed by sputtering.

Based on the foregoing, according to the method described above, the step coverage of interconnection layer 19 in through hole 401a can be made satisfactory.

However, in the above method, isotropic etching causes an enlargement of a dimension $L_3$ of the opening of through hole 401a. When dimension $L_3$ of the opening is increased, it would be difficult to pattern the interconnection layer if, for example, the through holes are formed adjacent to one another.

FIG. 28 is a schematic cross section showing how the through holes may be formed adjacent to one another. FIG. 29 is for illustrating the difficulty caused in the patterning of the interconnection layer when dimension $L_3$ of the opening is increased.

Referring first to FIG. 28, in order to ensure a satisfactory step coverage for interconnection layer 19 within hole 401c, depth $T_2$ of hole 401c must not exceed a predetermined depth. Accordingly, when film thickness $T_1$ of interlayer insulating film 401 is increased, it is necessary to increase a depth $T_3$ of hole 401b also. In an isotropic etching, the amount of etching performed vertically and the amount of etching performed laterally are approximately the same. Accordingly, the increase in depth $T_3$ of hole 401b essentially involves increase in width $L_3$ of the opening. In other words, the larger the film thickness $T_1$ of interlayer insulating film 401 is, the more increased is the dimension $L_3$ of the opening.

In this case, holes 401b are connected with one another at the region between the adjacent through holes 401a. As a result, interlayer insulating film 401 would have a sharp pointed shape at region $R_3$ where holes 401b are connected with one another. In such a region as $R_3$, the patterning of interconnection layer cannot be performed accurately.

Accordingly, when film thickness T, of interlayer insulating film 401 is made very large, it is necessary to increase the space $L_5$ between through holes 401a at least in such a manner that holes 401b will not be connected with one another. However, the increase in this space $L_5$ causes increase in the layout area when viewed two dimensionally and thus involves increase in the chip size.

SUMMARY OF THE INVENTION

It is an object of the present invention to provide a semiconductor device and a method of manufacturing the same, in which a satisfactory breakdown voltage can be obtained without increasing the chip size.

It is another object of the present invention to provide a semiconductor device having a higher breakdown voltage, and a method of manufacturing the same.

The semiconductor device of the present invention includes a first conductive layer, a second conductive layer, an insulating layer, and a third conductive layer. The second conductive layer can be provided with a voltage which is difference from that of the first conductive layer. The insulating layer is formed on the first and second conductive layers, and has a hole reaching the surface of the second conductive layer. The third conductive layer is formed on the insulating layer so as to be in contact with the second conductive layer through the hole, spaced apart from the first conductive layer with the insulating layer therebetween. The insulating layer is formed to have a first thickness at a region where the hole is formed, and to have a second thickness which is thicker than the first thickness at a region where the first and third conductive layers are opposite to one another.

In the semiconductor device of the present invention, the film thickness of the insulating film is relatively small at the region where the hole is formed. Therefore, even if the hole is formed by both isotropic and anisotropic etching, the width of the opening of the hole is not much increased. In addition, the film thickness of the insulating layer is relatively large at the region where the first and second conductive layers are opposite to one another. Accordingly, a high breakdown voltage can be ensured between the first and third conductive layers.

The method of manufacturing the semiconductor device of the present invention includes the following steps.

That is, forming a first conductive layer, and a second conductive layer such that a voltage which is different from that of the first conductive layer can be applied thereto; forming an insulating layer on the first and second conductive layers so that it would have a first thickness on the second conductive layer and a second thickness larger than the first thickness on the first conductive layer, and that it would have a hole reaching the second conductive layer at the region of the first thickness; and forming a third conductive layer on the insulating layer so that it is in contact with the second conductive layer through the hole, being opposite to the first conductive layer with the insulating film therebetween.

In the method of manufacturing the semiconductor device according to the present invention, the semiconductor device providing the above-described effects can be obtained.

In a semiconductor device according to one preferred aspect of the present invention, an insulating layer has a first insulating layer consisting of an inorganic type material and a second insulating layer consisting of an organic type material. The insulating layer includes the first insulating layer at the region where a hole is formed, and includes the first insulating layer at the region where first and third conductive layers are opposite to one another, and the second insulating layer formed on the first insulating layer.

In the semiconductor device according to the preferred one aspect of the present invention, the insulating layer has the second insulating layer including the organic type material at the region where the first and third conductive layers are opposed to one another. In the organic type material, saturation of the breakdown voltage is not likely even if the film thickness is increased, compared to the inorganic type material, so that a high breakdown voltage can be obtained. Accordingly, a higher breakdown voltage can be obtained between the first and third conductive layers.

In addition, film stress of an organic type material such as organic type silicon oxide film is extremely low compared to that of an inorganic type material such as inorganic type silicon oxide film. Therefore, even when the film thickness of an organic type silicon oxide film is increased, increase of the stress on the first and second conductive layers under the insulating layer can be suppressed. Thus, introduction of defects such as hillocks and cracks to the first and second conductive layers is suppressed.

Also, since an organic type material is included, etch selectivity of the first and second insulating layers can be set high. If the etch selectively is set high, the first insulating layer is hardly etched away when the second insulating layer is subjected to etching. Accordingly, the first insulating layer is hardly etched away even when the second insulating layer is formed on the first insulating layer and that second insulating layer is over-etched, so that the film thickness of the first insulating layer is maintained. Therefore, the etching is easily controlled such that the insulating layer has a hole of a desired depth, by setting in advance the film thickness of the first insulating layer to a thickness corresponding to the desired depth of the hole.

In a method of manufacturing a semiconductor device according to another preferred aspect of the present invention, an insulating layer has a first insulating layer consisting of an inorganic type material and a second insulating layer including an organic type material. A process of forming the insulating layer has a step of forming the first insulating layer on first and second conductive layers and forming a second insulating layer on the first insulating layer, above the first conductive layer.

In the method of manufacturing the semiconductor device according to this aspect of the present invention, a semiconductor device providing the above-described effects can be obtained.

In a semiconductor device according to yet another preferred aspect of the present invention, an insulating layer further has a third insulating layer consisting of an inorganic type material. The third insulating layer is formed between the third conductive layer and the second insulating layer.

In a semiconductor device according to this aspect of the present invention, since the third insulating layer consisting of the inorganic material exists between the third conductive layer and the second insulating layer, it is possible to improve the adhesiveness between the third conductive layer and the second insulating layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments in accordance with the present invention will be described hereinafter, with reference to the figures.

Embodiment 1

Figure 1A:
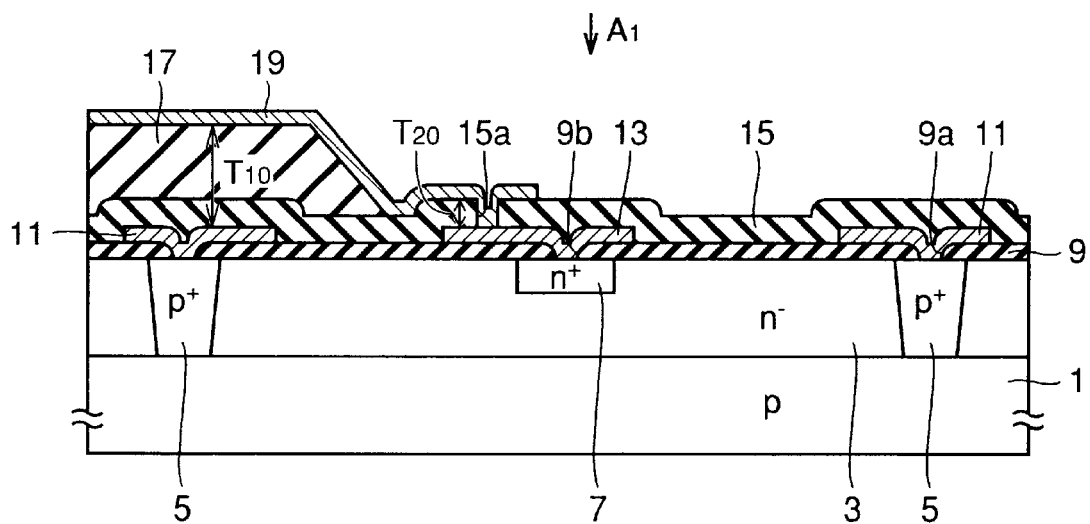
FIG. 1A is a schematic cross section showing a structure of a semiconductor device according to a first embodiment of the present invention.
Figure 1B:
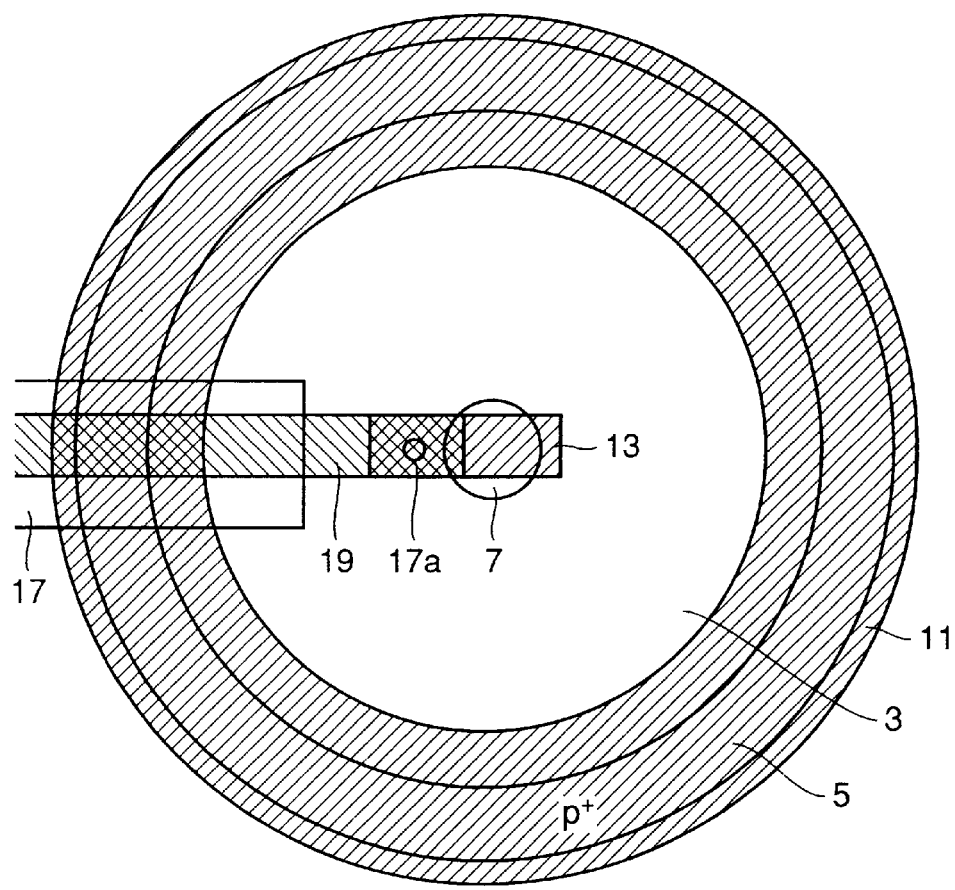
FIG. 1B is a schematic plan view taken from the direction of arrow $A_1$ of FIG. 1A.

Referring to FIGS. 1A and 1B, a semiconductor device of the present embodiment is different from the conventional example in the structure of an interlayer insulating film. In this embodiment, the interlayer insulating film has an inorganic type silicon oxide film and an organic type silicon oxide film 17. Inorganic type silicon oxide film 15 is formed entirely on the surface of a silicon oxide film 9 such that it covers first and second electrode layers 11 and 13. Organic type silicon oxide film 17 is formed above a portion of first electrode layer 11, on the surface of inorganic type silicon oxide film 15. This organic type silicon oxide film 17 consists of, for example, polyphenylsilsesquioxane.

At a region of inorganic type silicon oxide film 15 where organic type silicon oxide film 17 is not formed, a through hole 15a is formed. This through hole 15a reaches a portion of a surface of second electrode layer 13. An interconnection layer 19 is formed so as to be in contact with second electrode layer 13 via through hole 15a, spaced apart from first electrode layer 11 with inorganic type silicon oxide film 15 and organic type silicon oxide film 17 therebetween.

A film thickness $T_{20}$ of inorganic type silicon oxide film 15 at the region where through hole 15a is formed is smaller than $T_{10}$, which is the sum of the film thicknesses of inorganic type silicon oxide film 15 and organic type silicon oxide film 17 at the region where interconnection layer 19 and first electrode layer 11 are separated.

Since the structure of the semiconductor device of the present embodiment other than what has been described is mostly similar to the structure of the conventional example, further description is not given.

A method of manufacturing the semiconductor device of the present embodiment will now be described.

Figure 2:
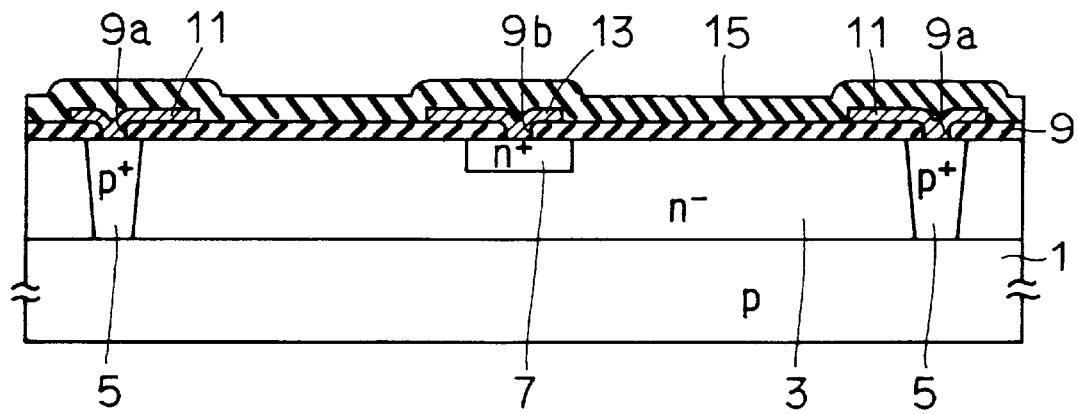
FIGS. 2 to 5 are schematic cross sections illustrating a method of manufacturing the semiconductor device according to the first embodiment of the present invention, presented in the order of the steps which are to be performed.

The manufacturing method of the present embodiment first performs the process shown in FIGS. 19 to 22 as in the conventional example. Thereafter, silicon oxide film 15 is formed entirely on the surface of silicon oxide film 9 by CVD (Chemical Vapor Deposition) using plasma, so as to cover first and second electrode layers 11 and 13 resulting in a structure shown in FIG. 2.

Figure 3:
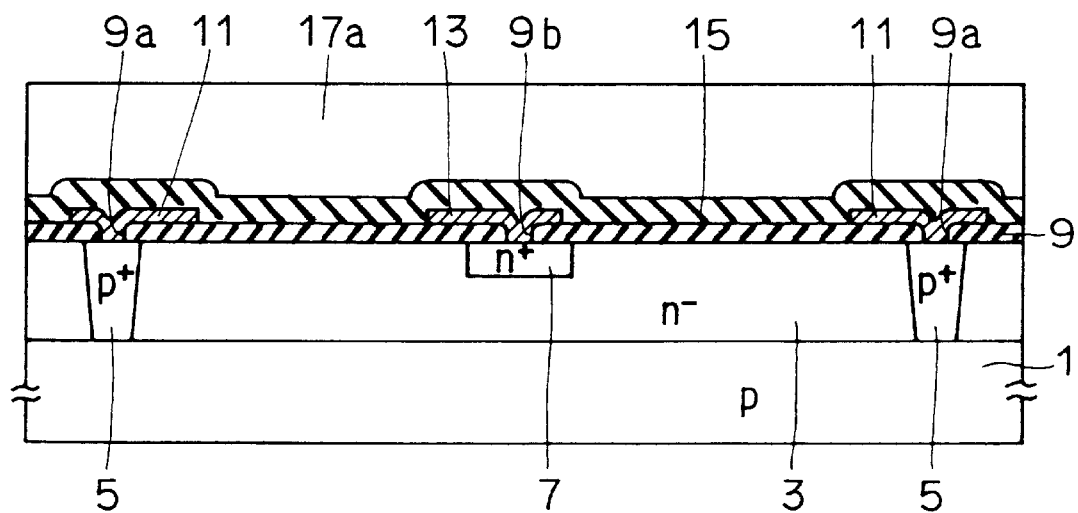

Referring to FIG. 3, an organic type silicon oxide film 17a is formed by spin coating, on the entire surface of inorganic type silicon oxide film 15. Only the predetermined region of this organic type silicon oxide film 17a is etched away, by an organic type solvent.

Figure 4:
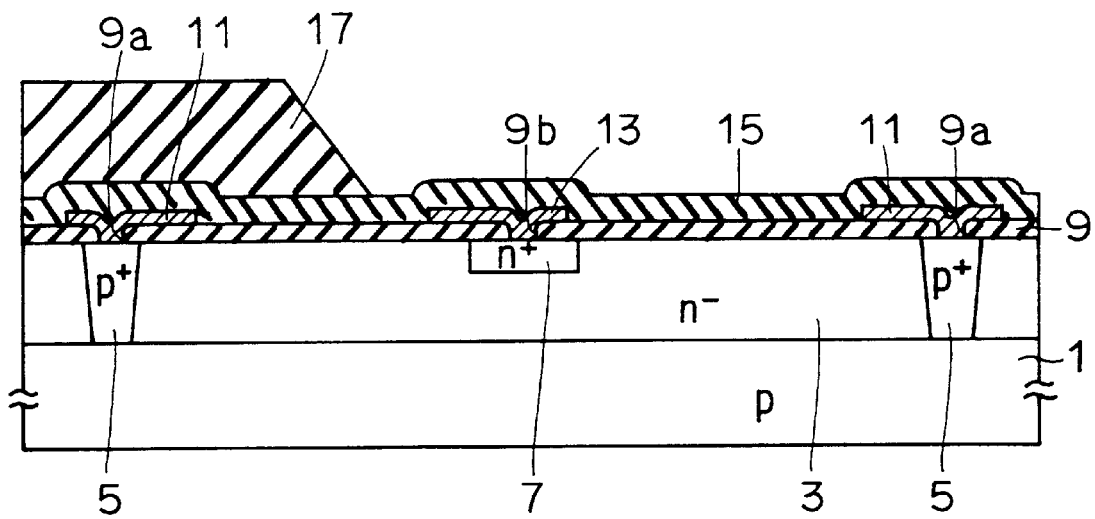

In this way, referring to FIG. 4, organic type silicon oxide film 17 is left above a portion of first electrode layer 11 only.

Figure 5:
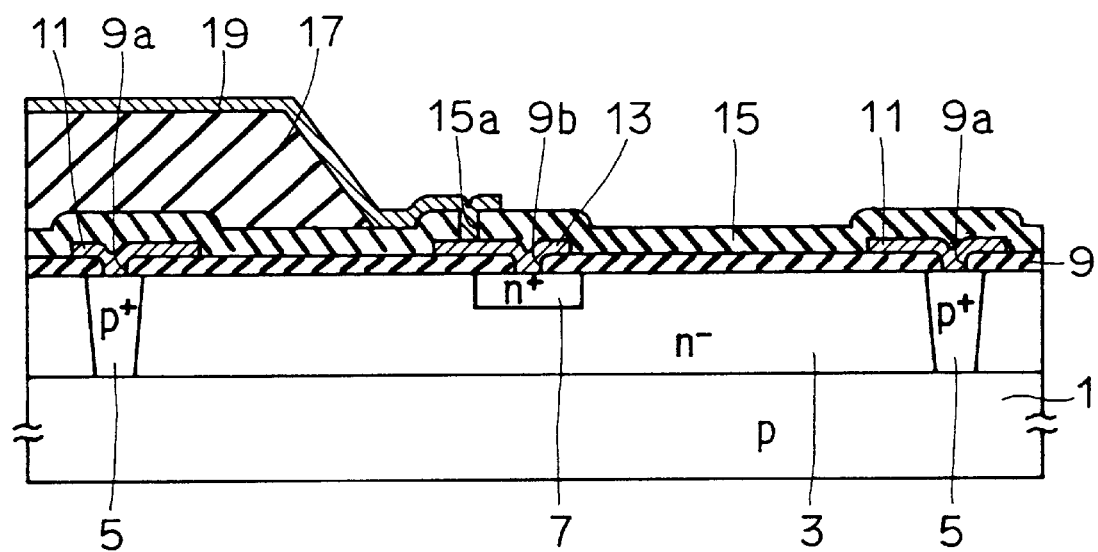

Referring to FIG. 5, through hole 15a reaching the surface of second electrode layer 13 is formed at a region of inorganic type silicon oxide film 15 where organic type silicon oxide film 17 is not formed. Interconnection layer 19 consisting of AlSi is formed such that it would be in contact with second electrode layer 13 via this through hole 15a, opposing first electrode layer 11.

In the semiconductor device of the present embodiment, an interlayer insulating film (inorganic type silicon oxide film 15) at the region where through hole 15a is formed, is formed to have film thickness $T_{20}$ which is smaller than film thickness $T_{10}$ of an interlayer insulating film (including inorganic type silicon oxide film 15 and organic type silicon oxide film 17) between first electrode layer 11 and interconnection layer 19. Accordingly, widening of the opening of through hole 15a is suppressed even if through hole 15a is formed by both isotropic etching and anisotropic etching. Thus, enlargement of the chip size due to the widening of the opening can be prevented.

Also, since film thickness $T_{20}$ of inorganic type silicon oxide film 15 is relatively small, a satisfactory step coverage can be obtained with interconnection layer 19 even when through hole 15a is formed by anisotropic etching only.

In addition, film thickness $T_{10}$ of inorganic type and organic type silicon oxide films 15 and 17 at the region where first electrode layer 11 and interconnection layer 19 are opposed to one another is relatively large. Accordingly, a satisfactory breakdown voltage between first electrode layer 11 and interconnection layer 19 can be ensured.

Figure 6:
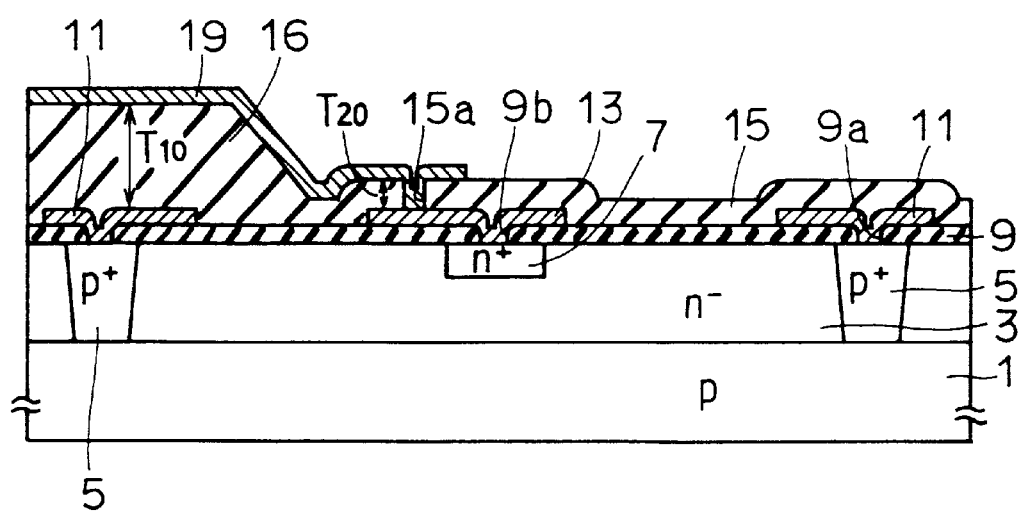
FIG. 6 is a schematic cross section showing a structure of a semiconductor device when an interlayer insulating film consists of a single layer of an inorganic type silicon oxide film.

Although the interlayer insulating film consists of inorganic type silicon oxide film 15 and organic type silicon oxide film 17 in the present embodiment, a structure as shown in FIG. 6 may also be employed. That is, in the structure shown in FIG. 6, the interlayer insulating film consists of a single layer of inorganic type silicon oxide film 16 only, for example. Except this point, this example is similar to the structure of FIG. 1.

However, when the present embodiment shown in FIG. 1 is compared with the structure shown in FIG. 6, the interlayer insulating film in FIG. 1 is formed to include organic type silicon oxide film 17. As a result, the structure shown in FIG. 1 has the following specific effects (a), (b), and (c):

(a) a higher breakdown voltage can be obtained;

(b) defects generated in the interconnections can be suppressed; and (c) the film thickness of the interlayer insulating film can be controlled easily.

These effects will be described in detail in the following.

(a) Improvement of the Breakdown Voltage

The inventors of the present invention have performed the following experiment in order to study the relationship between the film thickness and the breakdown voltage of the organic type silicon oxide film and the inorganic type silicon oxide film.

Figure 7:
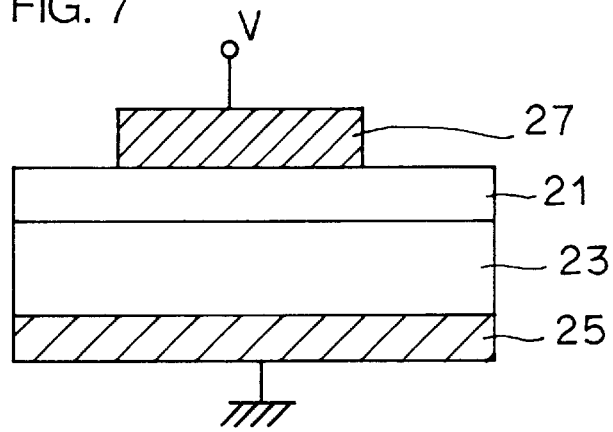
FIG. 7 is a schematic cross section showing a sample structure for studying the relationship between the film thickness of the oxide film and the breakdown voltage.

First, a sample having a structure shown in FIG. 7 was prepared.

Referring to FIG. 7, a silicon oxide film 21 which is to be evaluated by its breakdown voltage is formed entirely on the surface of an n type substrate 23. On the surface of this silicon oxide film 21, an electrode 27 consisting of AlSi is formed. In addition, an electrode 25 consisting of Au (gold) is formed on the rear surface of n type substrate 23.

When an inorganic type silicon oxide film formed by the use of plasma (hereinafter referred to as P-SiO$_2$) was used as silicon oxide film 21, the thickness thereof was made 8000 Å, 16000 Å, and 24000 Å and breakdown voltage for each thickness was measured. Film thickness of 16000 Å was obtained by stacking P-SiO$_2$ with film thickness of 8000 Å twice. Film thickness of 24000 Å was obtained by stacking P-SiO$_2$ with film thickness of 8000 Å three times.

Further, when TEOS (Tetra Ethoxy Silane) (inorganic) was used as silicon oxide film 21, the thickness thereof was made 6000 Å, 12000 Å, 18000 Å and 24000 Å and breakdown voltage for each thickness was measured. Film thickness of 12000 Å was obtained by stacking TEOS with film thickness of 6000 Å twice. Film thickness of 18000 Å was obtained by stacking TEOS with film thickness of 6000 Å three times. Film thickness of 24000 Å was obtained by stacking TEOS with film thickness of 6000 Å four times.

When polyphenylsilsesquioxane (hereinafter referred to as PPSQ; organic type silicon oxide film) was used as silicon oxide film 21, the thickness thereof was made 15000 Å and 30000 Å and breakdown voltage for each thickness was measured. Film thickness of 15000 Å and 30000 Å were both obtained by forming PPSQ at one time.

PPSQ is a hardened film of siliconladderpolymer shown in the following chemical formula:

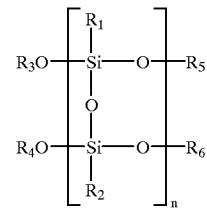

where $R_1$ and $R_2$ are phenyl group, lower alkyl group or photosensitive group; $R_3$, $R_4$, $R_5$ and $R_6$ are hydrogen atom, lower alkyl group or photosensitive group; and n represents an integer from 20 to 1000.

Breakdown voltage of silicon oxide film 21 was measured by setting the potential of electrode 25 in the sample shown in FIG. 7 to 0 and applying a negative potential V to electrode 27. The result of this measurement is shown in FIG. 8.

Figure 8:
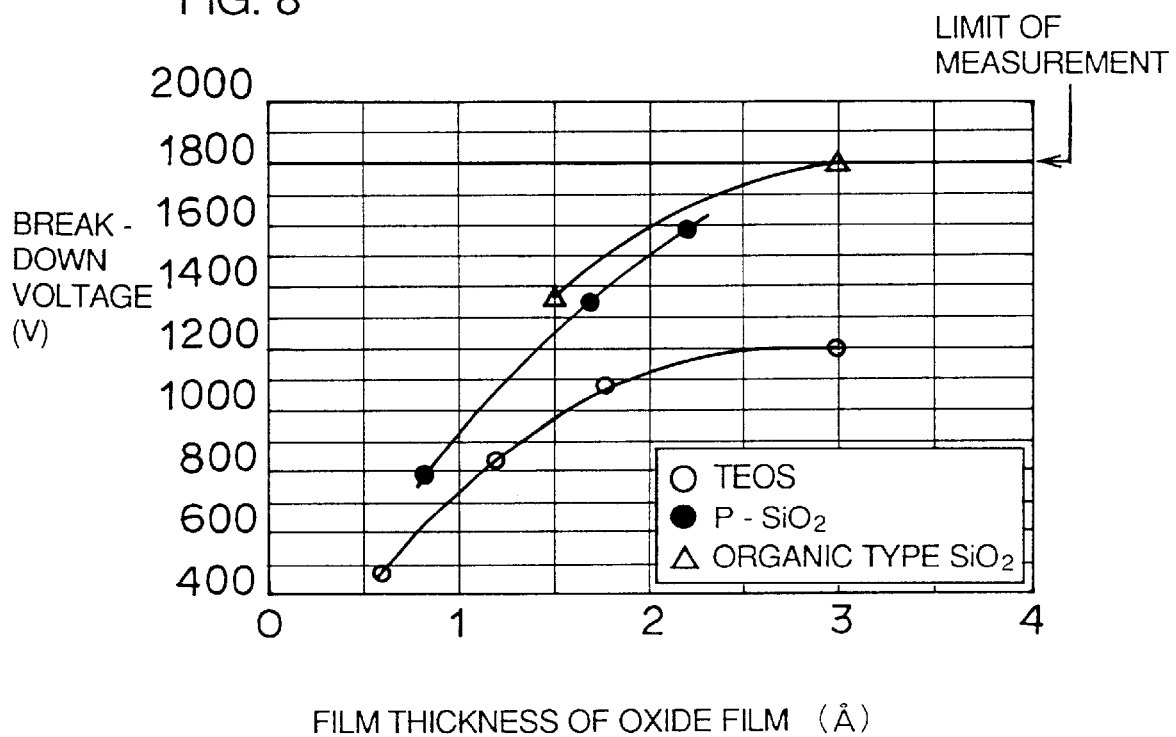
FIG. 8 is a graph showing the relationship between the film thickness of the oxide film and the breakdown voltage.

Referring to FIG. 8, it can be seen that breakdown voltage of an organic type silicon oxide film is higher than that of the inorganic type silicon oxide film. The possible reason is as follows.

When TEOS is formed to have a large film thickness at one time, separation could be very likely. Thus, when TEOS is used, it cannot be stacked with a film thickness of 1 μm or more at one time. Accordingly, it is supposed that the breakdown voltage of the TEOS is low. Also for the above reason, it is supposed that breakdown voltage of the TEOS is saturated at 1200V and is difficult to get higher than that.

Similarly for P-SiO$_2$, uniformity of the film thickness is degraded when formed to have a large film thickness at one time. Therefore, if the uniformity of the film thickness is taken into consideration, P-SiO$_2$ also cannot be formed with a thickness of 1 μm or more at one time. For this reason, it is suppressed that for P-SiO$_2$ also, breakdown voltage is saturated at a certain value as in TEOS and is difficult to get higher than that.

On the contrary, since the organic type silicon oxide film is formed by spin coating, a large film thickness can be obtained at one time. In addition, the uniformity of the organic type silicon oxide film formed in such a manner is satisfactory. Thus, it is not necessary to form the organic type silicon oxide film by a process including several steps even when it is to have a large film thickness. Accordingly, it is assumed that its breakdown voltage increases approximately in proportion to its film thickness. Therefore, even when it is assumed that the breakdown voltage of the organic type silicon oxide film is saturated at a certain value, this saturation value would probably be higher than that of an inorganic type silicon oxide film.

Based on the above-described results and considerations, it is impossible to obtain a breakdown voltage which exceeds a certain value even when film thickness $T_{11}$ of first electrode layer 11 and interconnection layer 13 is increased as shown in FIG. 6. Therefore, the breakdown voltage obtained with the inorganic type silicon oxide film would not be efficient considering the differences among the power supplies of various countries and the increase of power supply value in the future.

On the contrary, when organic type silicon oxide film 17 is used for the interlayer insulating film between first electrode layer 11 and interconnection layer 19 as shown in FIG. 1, a high breakdown voltage can be obtained easily by increasing the film thickness of organic type silicon oxide film 17, since it is supposed that the breakdown voltage of organic type silicon oxide film 17 would not saturate easily.

(b) Suppression of the Defects being Introduced to the Interconnections

Film stress of an organic type silicon oxide film is extremely low compared to that of an inorganic type silicon oxide film. Accordingly, it is possible to suppress increase in stress on first electrode layer 11 under the interlayer insulating films (inorganic type and organic type silicon oxide films 15 and 17), even when the film thickness of the organic type silicon oxide film is increased. In this way, the introduction of the defects such as hillocks and cracks to first electrode layer 11 (or the interconnection layer) is suppressed.

(c) Easy Control of the Film Thickness of the Interlayer Insulating Film

As described above, the present invention is characterized in that the film thickness of an interlayer insulating film at a region where through hole 15a is formed is made smaller than the film thickness of the interlayer insulating film at the region where first electrode layer 11 and interconnection layer 19 are opposite to one another. For this purpose, etching is required to make smaller the film thickness of the interlayer insulating film at the region where through hole 15a is formed. However, if the interlayer insulating film consists of a single layer of inorganic type silicon oxide film as shown in FIG. 6, it is difficult to control the amount of etching.

In particular, referring to FIG. 6, this etching is effected with a mask provided on the region where first electrode layer 11 is opposed to interconnection layer 19 so as to remove the portions other than the portion of the mask. If the film to be etched is a single layer, however, it is difficult to stop the etching at the time when a desired film thickness is obtained. Accordingly, there is a possibility that when etching is done excessively, second electrode layer 13 may be exposed. On the other hand, when etching is not sufficient, the interlayer insulating film on second electrode layer 13 is made thicker than what is desired and thus the depth of the through hole is made larger. When the depth of the through hole is increased, the step coverage of the interconnection film 19 is degraded as described previously, or the opening of the through hole becomes too wide.

By contrast, when the interlayer insulating film has an organic type silicon oxide film and an inorganic type silicon oxide film, the etch selectivity of the organic type silicon oxide film and the inorganic type silicon oxide film can be set higher. If the etch selectivity is set higher, the inorganic type silicon oxide film is hardly etched away upon the etching of the organic type silicon oxide film. Therefore, when the organic type silicon oxide film is formed on the inorganic type silicon oxide film and the organic type silicon oxide film is subjected to overetching, the inorganic type silicon oxide film is hardly etched away and its film thickness is maintained. Accordingly, by setting the film thickness of the inorganic type silicon oxide film in advance to a thickness corresponding to a desired depth of the through hole, the etching of the interlayer insulating film can be easily controlled so that the desired depth of the through hole is obtained.

Embodiment 2

Figure 9:
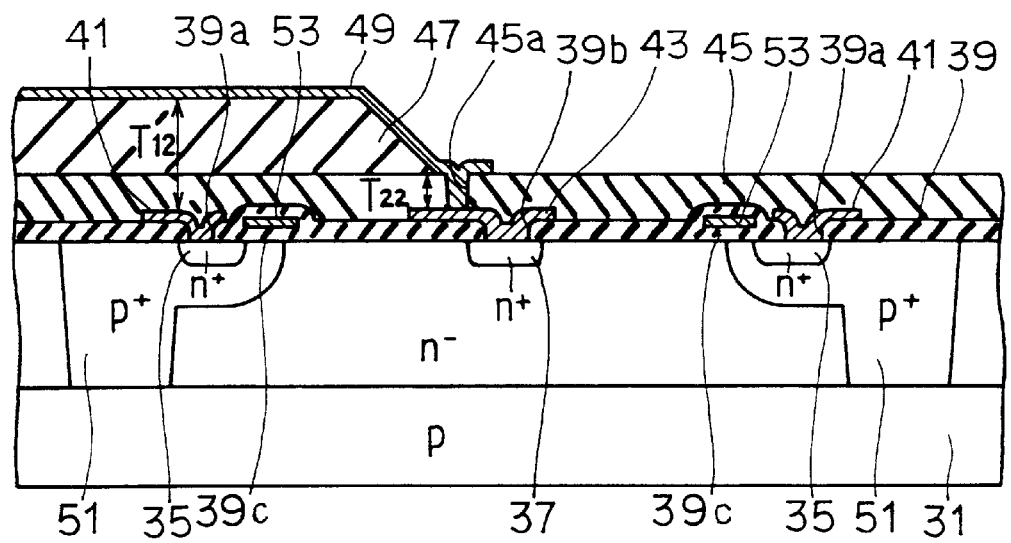
FIG. 9 is a schematic cross section showing a structure of a semiconductor device according to a second embodiment of the present invention.

Referring to FIG. 9, a semiconductor device of the present embodiment is an n channel MOS (Metal Oxide Semiconductor) transistor of a type having a high breakdown voltage. An $n^-$ epitaxial layer 33 and a $p^+$ diffused region 51 are formed on a p type semiconductor substrate 31. $p^+$ diffused region 51 is formed to have an annular configuration surrounding $n^-$ epitaxial layer 33 when viewed two dimensionally.

At a surface of $n^-$ epitaxial layer 33, an $n^+$ diffused region 37 is formed, which is to be a drain. Also, at the surface within $p^+$ diffused region 51 is formed an $n^+$ diffused region 35 which is to be a source. A region between these $n^+$ diffused region 35 and $n^-$ epitaxial layer 33 near the surface is defined as a channel region. A gate electrodes 53 is formed on this channel region with a silicon oxide film 39c therebetween.

A silicon oxide film 39 is formed so as to cover these gate electrode 53, $p^+$ diffused region 51 and $n^-$ epitaxial layer 33. At this silicon oxide film 39, a contact hole 39a reaching a portion of a surface of $n^+$ diffused region 35 which is to be the source, and a contact hole 39b reaching a portion of a surface of $n^+$ diffused region 37 which is to be the drain are formed. A first electrode layer 41 is formed so that it would be in contact with $n^+$ diffused region 35 which is to be the source, through contact hole 39a. A second electrode layer 43 is formed so that it would be in contact with $n^+$ diffused region 37 which is to be the drain, through contact hole 39b. These first and second electrode layers 41 and 43 are formed of AlSi, for example.

An inorganic type silicon oxide film 45 is formed entirely on the surface of silicon oxide film 39 so as to cover first and second electrode layers 41 and 43. Also, an organic type silicon oxide film 47 is formed on the surface of inorganic type silicon oxide film 45, above a portion of a surface of first electrode layer 41. This organic type silicon oxide film 47 consists of, for example, polyphenylsilsesquioxane. Further, at a region of inorganic type silicon oxide film 45 where organic type silicon oxide film 47 is not formed, a through hole 45a reaching second electrode layer 43 is formed.

An interconnection layer 49 is formed spaced apart from first electrode layer 41 with inorganic type and organic type silicon oxide films 45 and 47 therebetween, so as to be in contact with second electrode layer 43 via this through hole 45a. This interconnection layer 49 is formed, for example, of AlSi.

As in the first embodiment, the semiconductor device of the present embodiment also has a relatively small film thickness $T_{22}$ for the interlayer insulating film at the region where through hole 45a is formed, and a relatively large film thickness $T_{12}$ for the interlayer insulating film at the region where first electrode layer 41 and interconnection layer 49 are separated from each other. Accordingly, a satisfactory breakdown voltage can be obtained without increasing the chip size.

In addition, the interlayer insulating film has a double-layered structure consisting of inorganic type silicon oxide film 45 and organic type silicon oxide film 47, at the region where first electrode 41 and interconnection layer 49 are separated from one another. Accordingly, the present embodiment also has an effect that is similar to (a), (b) and (c) as described in the first embodiment.

Embodiment 3

Figure 10:
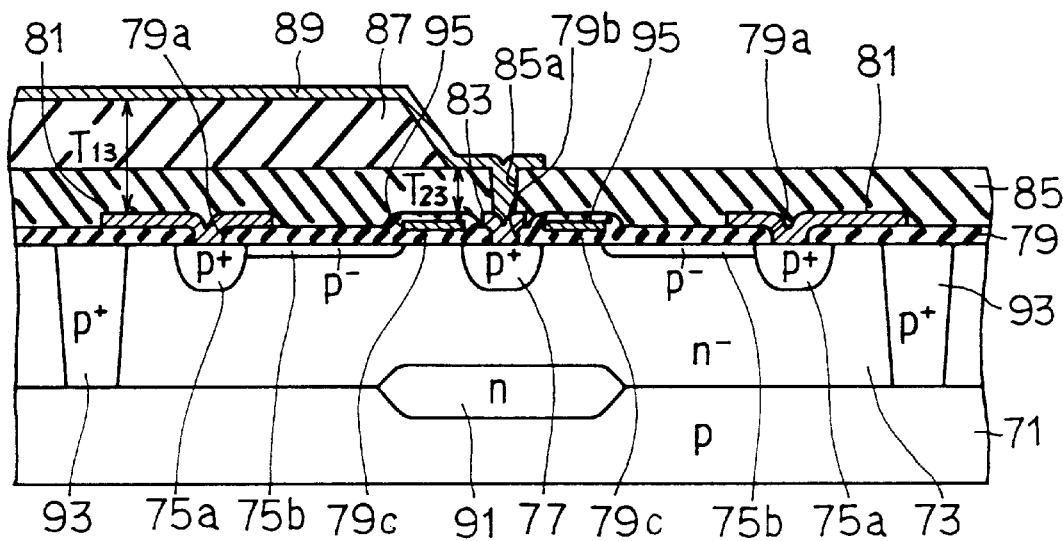
FIG. 10 is a schematic cross section showing a structure of a semiconductor device according to a third embodiment of the present invention.

Referring to FIG. 10, a semiconductor device of the present embodiment is a p channel MOS transistor of a type having a high breakdown voltage. On the surface of a p type semiconductor substrate 71, an $n^-$ epitaxial layer 73 and a $p^+$ diffused region 93 are formed. In addition, an n type buried layer 91 is formed between p type semiconductor substrate 71 and $n^-$ epitaxial layer 73.

A $p^+$ diffused region 75a which is to be a drain is formed at a surface of $n^-$ epitaxial layer 73. Adjacent to this $p^+$ diffused region 75a, a $p^-$ diffused region 75b is formed at the surface of n⁻ epitaxial layer 73. Also at the surface of n⁻ epitaxial layer 73, a p⁺ diffused region 77 which is to be a source is formed, spaced apart by a predetermined distance from p⁻ diffused region 75b. A gate electrode 95 is formed on a region between these p⁺ diffused region 77 and p⁻ diffused region 75b, with an insulating film 79c therebetween. Covering this gate electrode 95 as well as n⁻ epitaxially grown layer 73 and p⁺ diffused region 93, a silicon oxide film 79 is formed.

At silicon oxide film 79, a contact hole 79a reaching a portion of a surface of p⁺ diffused region 75a which is to be the drain and a contact hole 79b reaching the surface of p⁺ diffused region 77 which is to be the source are formed. A first electrode layer 81 consisting of AlSi, for example, is formed so as to be in contact with p⁺ diffused region 75a which is to be the drain, through contact hole 79a. A second electrode layer 83 consisting of AlSi, for example, is also formed so as to be in contact with p⁺ diffused region 77 which is to be the source, through contact hole 79b.

Covering these first and second electrode layers 81 and 83, an inorganic type silicon oxide film 85 is formed entirely on the surface of silicon oxide film 79. An organic type silicon oxide film 87 is formed on the surface of inorganic type silicon oxide film 85 above a portion of the surface of the first electrode layer 81. This organic type silicon oxide film 87 is formed, for example, of polyphenylsilsesquioxane. On a region of inorganic type silicon oxide film 85 where organic type silicon oxide film 87 is not formed, a through hole 85a reaching a portion of the surface of second electrode layer is formed.

An interconnection layer 89, for example, of AlSi, is formed so as to be in contact with second electrode layer 83 via this through hole 85a, spaced apart from first electrode layer 81 with inorganic type and organic type silicon oxide films 85 and 87 therebetween.

In the semiconductor device of the present embodiment, a film thickness $T_{23}$ of the interlayer insulating film at the region where through hole 85a is formed is smaller than a film thickness $T_{13}$ of the interlayer insulating film at the region where first electrode layer 81 and interconnection layer 89 are separated from one another. Accordingly, a satisfactory breakdown voltage can be obtained without increasing the chip size.

Furthermore, at the region where first electrode layer 81 and interconnection layer 89 are separated from one another, the interlayer insulating film has a double-layered structure consisting of inorganic type silicon oxide film 85 and organic type silicon oxide film 87. Therefore, the semiconductor device of the present embodiment also has the effects which are similar to (a), (b), and (c) described in the first embodiment.

Embodiment 4

Figure 11:
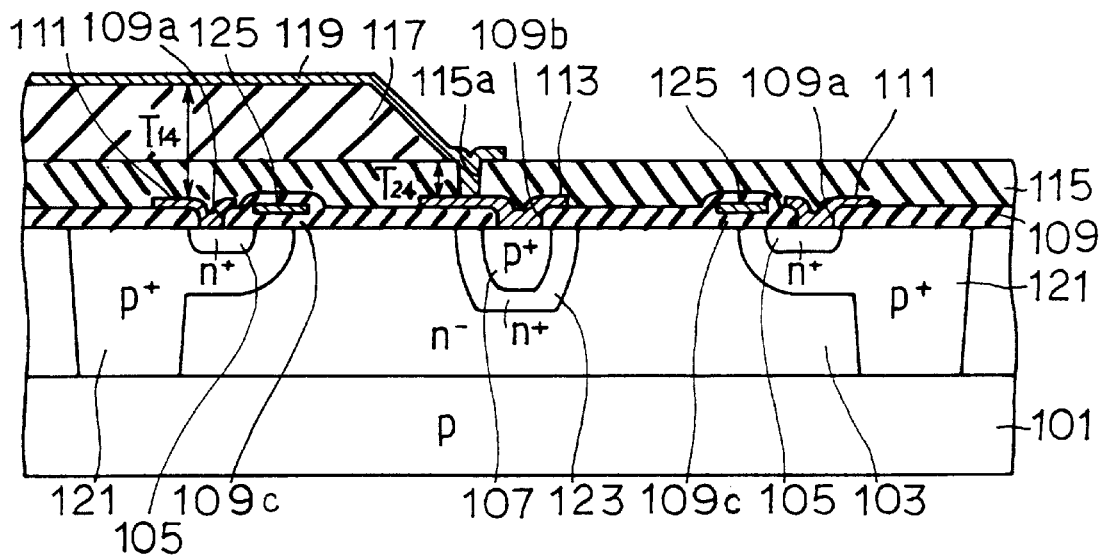
FIG. 11 is a schematic cross section showing a structure of a semiconductor device according to a fourth embodiment of the present invention.

Referring to FIG. 11, a semiconductor device of the present embodiment is an n channel IGBT (Insulated Gate Bipolar Transistor) of a type having a high breakdown voltage. An n⁻ epitaxial layer 103 and a p⁺ diffused region 121 are formed on the surface of a p type semiconductor substrate 101.

An n⁺ diffused region 105 is formed in a surface of p⁺ diffused region 121. In addition, an n⁺ diffused region 123 is formed in a surface within n epitaxial layer 103. At a surface within this n⁺ diffused region 123, a p⁺ diffused region 107 is formed. A gate electrode 125 is formed on a region in the vicinity of the surface between n⁺ diffused region 105 and n⁻ epitaxial layer 103, with a silicon oxide film 109c therebetween. Covering this gate electrode 125, a silicon oxide film 109 is formed on the surfaces of n⁻ epitaxial layer 103 and p⁺ diffused region 121.

A contact hole 109a reaching a portion of a surface of n⁺ diffused region 105 and a contact hole 109b reaching a portion of a surface of p⁺ diffused region 107 is formed at silicon oxide film 109. An emitter electrode 111 is formed, being in contact with n⁺ diffused region 105 through contact hole 109a. A collector electrode 113 is also formed, being in contact with p⁺ diffused region 107 through contact hole 109b.

An inorganic type silicon oxide film 115 is formed entirely on the surface of silicon oxide film 109 so as to cover these emitter electrode 111 and collector electrode 113. An organic type silicon oxide film 117 is formed on the surface of inorganic type silicon oxide film 115 above a portion of the surface of emitter electrode 111. This organic type silicon oxide film 117 is formed, for example, of polyphenylsilsesquioxane. At a region of inorganic type silicon oxide film 115 where organic type oxide film 117 is not formed, a through hole 115a is formed, reaching a portion of the surface of collector electrode 113.

A interconnection layer 119 of AlSi is formed so as to be in contact with collector electrode 113 via this through hole 115a, spaced apart from emitter electrode 111 with inorganic and organic type silicon oxide films 115 and 117 therebetween.

In the semiconductor device of the present embodiment, a film thickness $T_{24}$ of an interlayer insulating film at the region where through hole 115a is formed is also smaller than a film thickness $T_{14}$ of the interlayer insulating film at the region between emitter electrode 111 and interconnection layer 119. Accordingly, a satisfactory breakdown voltage can be obtained without increasing the chip size.

Furthermore, at the region where emitter electrode 111 and interconnection layer 119 are separated, the interlayer insulating film has a double-layered structure consisting of inorganic type silicon oxide film 115 and organic type silicon oxide film 117. Therefore, the semiconductor device of the present embodiment also has the effects which are similar to (a), (b), and (c) described in the first embodiment.

Embodiment 5

Figure 12:
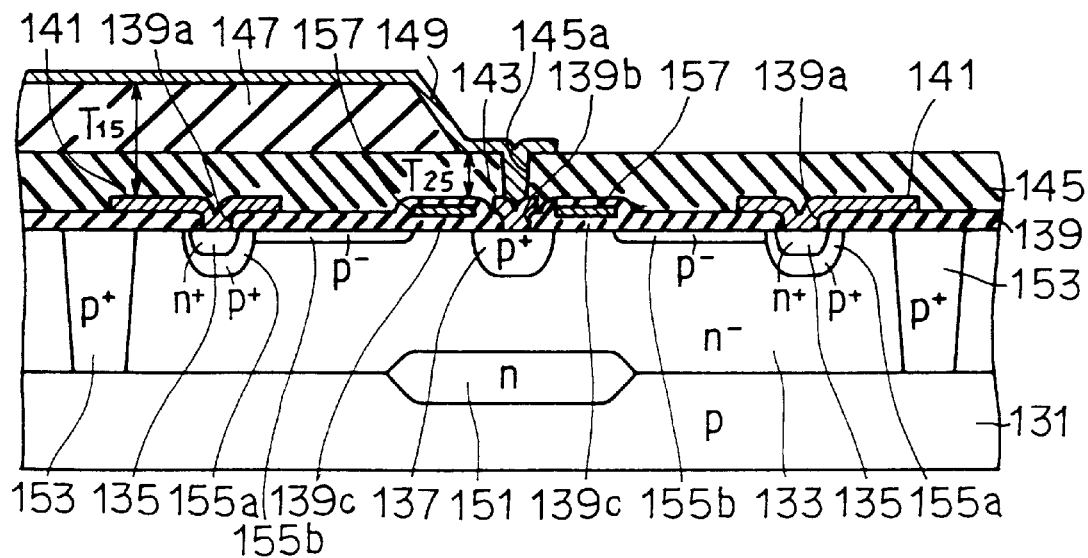
FIG. 12 is a schematic cross section showing a structure of a semiconductor device according to a fifth embodiment of the present invention.

Referring to FIG. 12, a semiconductor device of the present embodiment is a p channel IGBT of a type having a high breakdown voltage. An n⁻ epitaxial layer 133 and a p⁺ diffused region 153 are formed on a surface of a p type semiconductor substrate 131. An n type buried layer 151 is formed between p type semiconductor substrate 131 and n⁻ epitaxial layer 133.

A first p⁺ diffused region 155a, a p⁻ diffused region 155b, and a second p⁺ diffused region 137 are formed at the surface of n⁻ epitaxial layer 133. First p⁺ diffused region 155a and p⁻ diffused region 155b are formed adjacent to each other. Also, p⁻ diffused region 155b and second p⁻ diffused region 137 are formed so that there is a predetermined distance between them. At the surface within first p⁺ diffused region 155a, an n⁺ diffused region 135 is formed.

A gate electrode 157 is formed on a region between p⁻ diffused region 155b and second p⁺ diffused region 137, with a silicon oxide film 139c therebetween. Covering this gate electrode 157, a silicon oxide film 139 is formed.

At silicon oxide film 139, a contact hole 139a reaching a portion of a surface of n⁺ diffused region 135 and a contact hole 139b reaching a portion of a surface of second p⁺ diffused region 137 are formed. A collector electrode 141 of AlSi, for example, is formed so that it would be in contact with n⁺ diffused region 135 via contact hole 139a. Also, an emitter electrode 143 of AlSi, for example, is formed so that it would be in contact with second p⁺ diffused region 137 via contact hole 139b.

Covering these collector electrode 141 and emitter electrode 143, an inorganic type silicon oxide film 145 is formed entirely on the surface of silicon oxide film 139. In addition, an organic type silicon oxide film 147 is formed on the surface of inorganic type silicon oxide film 145 above a portion of a surface of a collector electrode 141. This organic type silicon oxide film 147 is formed, for example, of polyphenylsilsesquioxane. A through hole 145a exposing a portion of the surface of emitter electrode 143 is formed at a region of inorganic type silicon oxide film 145 where organic type silicon oxide film 147 is not formed.

An interconnection layer 149 of AlSi, for example, is formed so that it would be in contact with emitter electrode 143 via this through hole 145a, spaced apart from collector electrode 141 with inorganic type and organic type silicon oxide films 145 and 147 therebetween.

In the semiconductor device of the present embodiment, a film thickness $T_{25}$ of an interlayer insulating film at the region where through hole 145a is formed is smaller than a film thickness $T_{15}$ of an interlayer insulating film at the region where collector electrode 141 and interconnection layer 149 are separated from to each other. Accordingly, a satisfactory breakdown voltage can be obtained without increasing the chip size.

Furthermore, at the region where collector electrode 141 and interconnection layer 149 are separated from each other, the interlayer insulating film has a double-layered structure consisting of inorganic type silicon oxide film 145 and organic type silicon oxide film 147. Therefore, effects which are similar to that of (a), (b), and (c) described in the first embodiment can also be obtained in the present embodiment.

Embodiment 6

Figure 13:
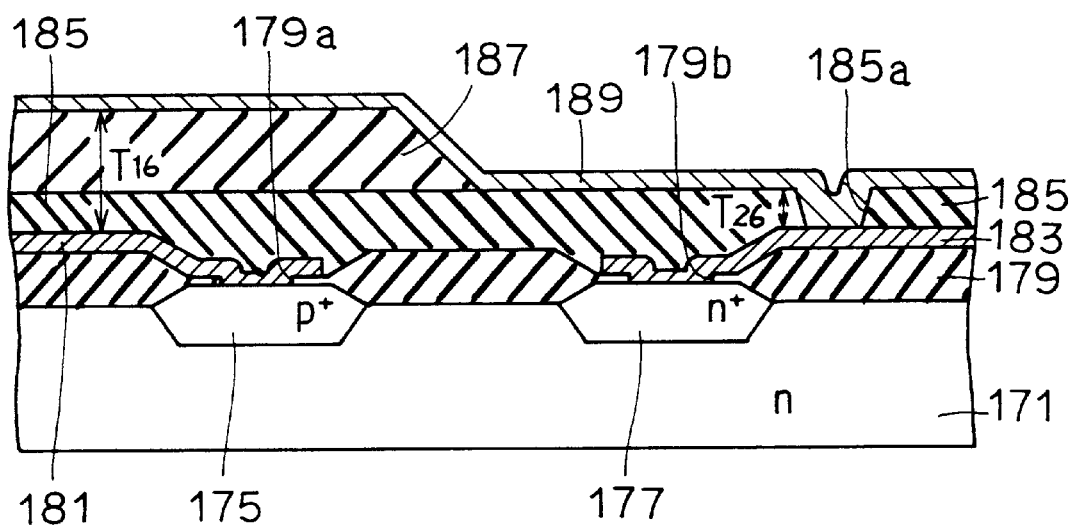
FIG. 13 is a schematic cross section showing a structure of a semiconductor device according to a sixth embodiment of the present invention.

Referring to FIG. 13, an element isolating oxide film 179 is formed with a predetermined shape, on the surface of an n type semiconductor substrate 171. At regions of the surface of n type semiconductor substrate 171, each of which regions being isolated by this element isolating oxide film 179, a $p^+$ diffused region 175 and an $n^+$ diffused region 177 are formed. A first interconnection layer 181 is formed so as to be in contact with the surface of this $p^+$ diffused region 175. Also, a second interconnection layer 183 is formed so as to be in contact with a portion of the surface of $n^+$ diffused region 177.

Covering these first and second interconnection layers 181 and 183, an inorganic type silicon oxide film 185 is formed entirely on the surface of n type semiconductor substrate 171. An organic type silicon oxide film 187 is formed on the surface of inorganic type silicon oxide film 185 above a portion of the surface of first interconnection layer 181. This organic type silicon oxide film 187 is of polyphenylsilsesquioxane, for example. At a region of inorganic type silicon oxide film 185 where organic type silicon oxide film 187 is not formed, a through hole 185a is formed, reaching a portion of the surface of second interconnection layer 183.

A third interconnection layer 189 is formed so that it would be in contact with second interconnection layer 183 via this through hole 185a, separated apart from first interconnection layer 181 with inorganic type and organic type silicon oxide films 185 and 187 therebetween.

In the semiconductor device of the present embodiment, a film thickness $T_{26}$ of an interlayer insulating film at a region where through hole 185a is formed is smaller than a film thickness $T_{16}$ of the interlayer insulating film at a region where first and third interconnection layers 181 and 189 are separated from each other. Therefore, a satisfactory breakdown voltage can be obtained without increasing the chip size.

Furthermore, the interlayer insulating film at the region where first interconnection layer 181 and third interconnection layer 189 are separated from each other has a double-layered structure consisting of inorganic type silicon oxide film 185 and organic type silicon oxide film 187. Accordingly, the semiconductor device of the present embodiment has similar effects as in the first embodiment described as (a), (b), and (c).

Embodiment 7

Figure 14:
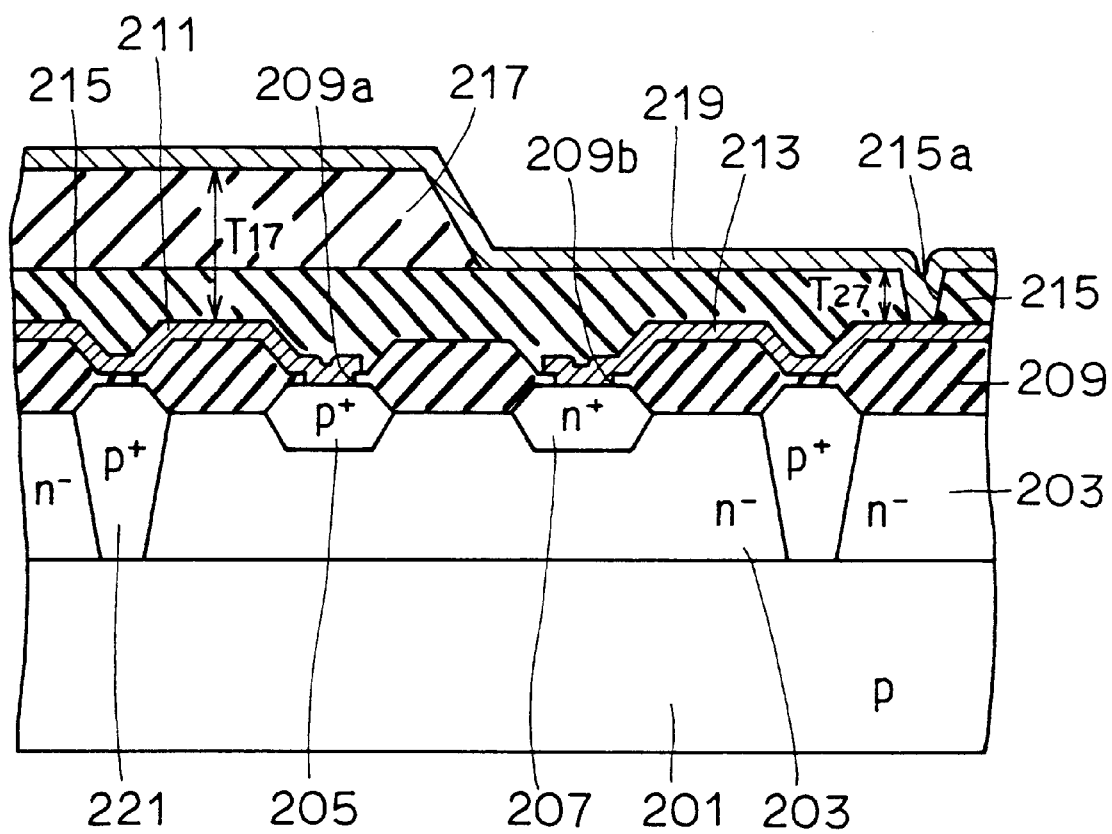
FIG. 14 is a schematic cross section showing a structure of a semiconductor device according to a seventh embodiment of the present invention.

Referring to FIG. 14, an $n^-$ epitaxial layer 203 and a $p^+$ diffused region 221 are formed on the surface of a p type semiconductor substrate 201. Also, at surfaces of $n^-$ epitaxial layer 203 and $p^+$ diffused region 221, an element isolating oxide film 209 having a predetermined shape is formed, with a predetermined distance therebetween. At the surface of $n^-$ epitaxial layer 203 which is isolated by this element isolating oxide film 209, a $p^+$ diffused region 205 and a $n^+$ diffused region 207 are formed. A first interconnection layer 211 is formed so as to be in contact with a portion of a surface of this p diffused region 205. Also, a second interconnection layer 213 is formed so as to be in contact with a portion of the surface of $n^+$ diffused region 207.

Covering these first and second interconnection layers 211 and 213, an inorganic type silicon oxide film 215 is formed entirely on the surfaces of $n^-$ epitaxial layer 203 and p diffused region 221. An organic type silicon oxide film 217 is formed on the surface of inorganic type oxide film 215 above a portion of the surface of first interconnection layer 211. This organic type silicon oxide film 217 is formed of polyphenylsilsesquioxane, for example. At a region of inorganic type silicon oxide film 215 where organic type silicon oxide film 217 is not formed, a through hole 215a is formed, reaching a portion of the surface of second interconnection layer 213.

A third interconnection layer 219 of AlSi is formed, such that it would be in contact with second interconnection layer 213 via this through hole 215a, and that it would be separated from first interconnection layer 211 with inorganic type and organic type silicon oxide films 215 and 217 therebetween.

In the present embodiment, a film thickness $T_{27}$ of an interlayer insulating film at the region where through hole 215a is formed is smaller than a film thickness $T_{17}$ of the interlayer insulating film at the region where first interconnection layer 211 and third interconnection layer 219 are spaced apart from each other. Accordingly, a satisfactory breakdown voltage can be obtained without increasing the chip size.

Furthermore, at the region where first interconnection layer 211 and third interconnection layer 219 are spaced apart from each other, the interlayer insulating film has a double-layered structure consisting of inorganic type silicon oxide film 215 and organic type silicon oxide film 217. Therefore, the semiconductor device of the present embodiment has similar effects as in the first embodiment described as (a), (b), and (c).

Embodiment 8

Figure 15:
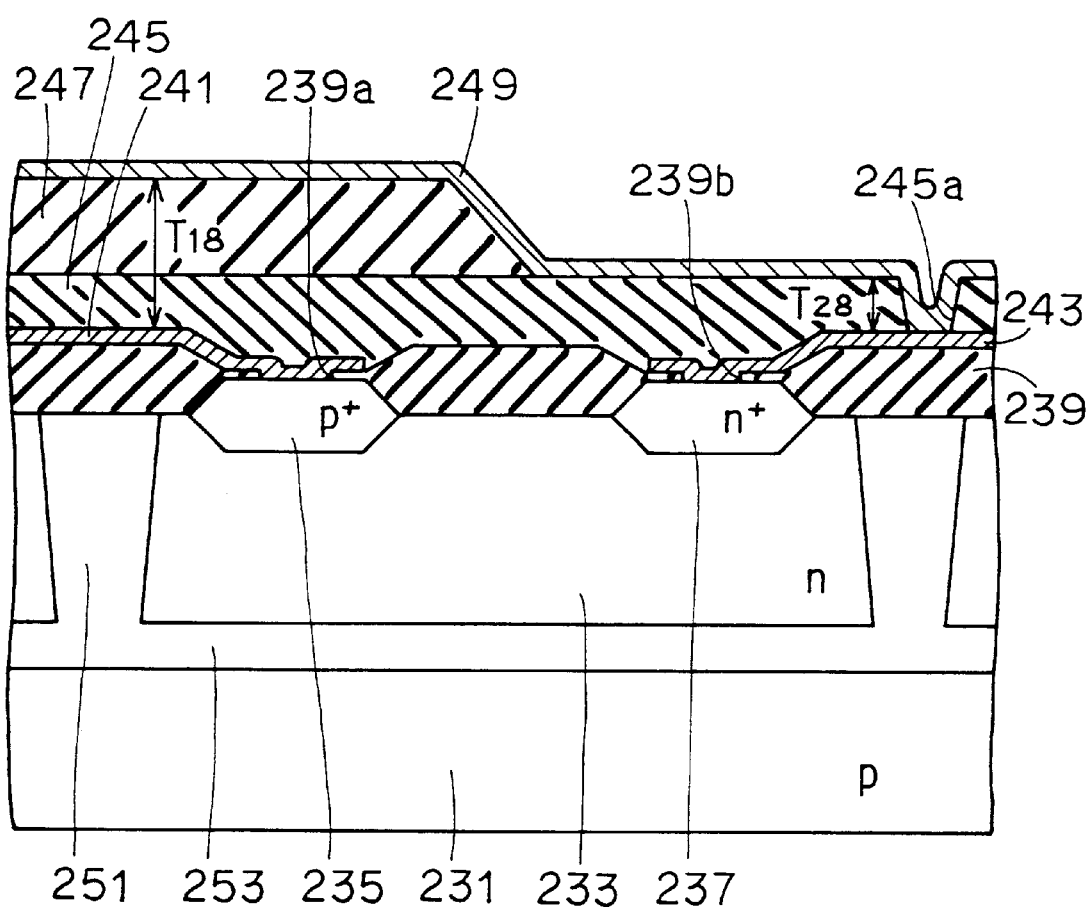
FIG. 15 is a schematic cross section showing a structure of a semiconductor device according to an eighth embodiment of the present invention.

Referring to FIG. 15, a semiconductor device of the present embodiment has a dielectric isolating structure. An n type substrate 233 is attached on a surface of a p type semiconductor substrate 231, with a silicon oxide film 253 therebetween. This n type substrate 233 is isolated electrically by a silicon oxide film 251. An element isolating oxide film 239 is formed at the surface of this n type substrate 233. At the surface of n type substrate 233 which is isolated by this element isolating oxide film 239, a $p^+$ diffused region 235 and a $n^+$ diffused region 237 are formed, respectively.

A first interconnection layer 241 is formed so as to be in contact with a portion of the surface of p⁺ diffused region 235. Also, a second interconnection layer 243 is formed so as to be in contact with a portion of the surface of n⁺ diffused region 237.

Cove ring these first and second interconnection layers 241 and 243, an inorganic type silicon oxide film 245 is formed entirely on the surfaces of n type substrate 233 and silicon oxide film 251. An organic type silicon oxide film 247 is formed on the surface of inorganic type silicon oxide film 245 above first interconnection layer 241. This organic type silicon oxide film 247 is formed of polyphenylsilsesquioxane, for example. At a region of inorganic type silicon oxide film 245 where organic type silicon oxide film 247 is not formed, a through hole 245a is formed, reaching a portion of the surface of second interconnection layer 243.

A third interconnection layer 249 of AlSi, for example, is formed such that it would be in contact with second interconnection layer 243 via through hole 245a and that it would be spaced apart from first interconnection layer 241 with inorganic type and organic type silicon oxide films 245 and 247 therebetween.

In this embodiment, a film thickness $T_{2S}$ of an interlayer insulating film at a region where through hole 245a is formed is smaller than a film thickness $T_{1S}$ of the interlayer insulating film at the region where first interconnection layer 241 and third interconnection layer 249 are opposed to each other. Accordingly, a satisfactory breakdown voltage can be obtained without increasing the chip size.

Furthermore, at a region where first interconnection layer 241 and third interconnection layer 249 are separated from each other, the interlayer insulating film has a doubled-layered structure consisting of inorganic type silicon oxide film 245 and organic type silicon oxide film 247. Therefore, the semiconductor device of the present embodiment has similar effects as in the first embodiment described as (a), (b), and (c).

Embodiment 9

Figure 16:
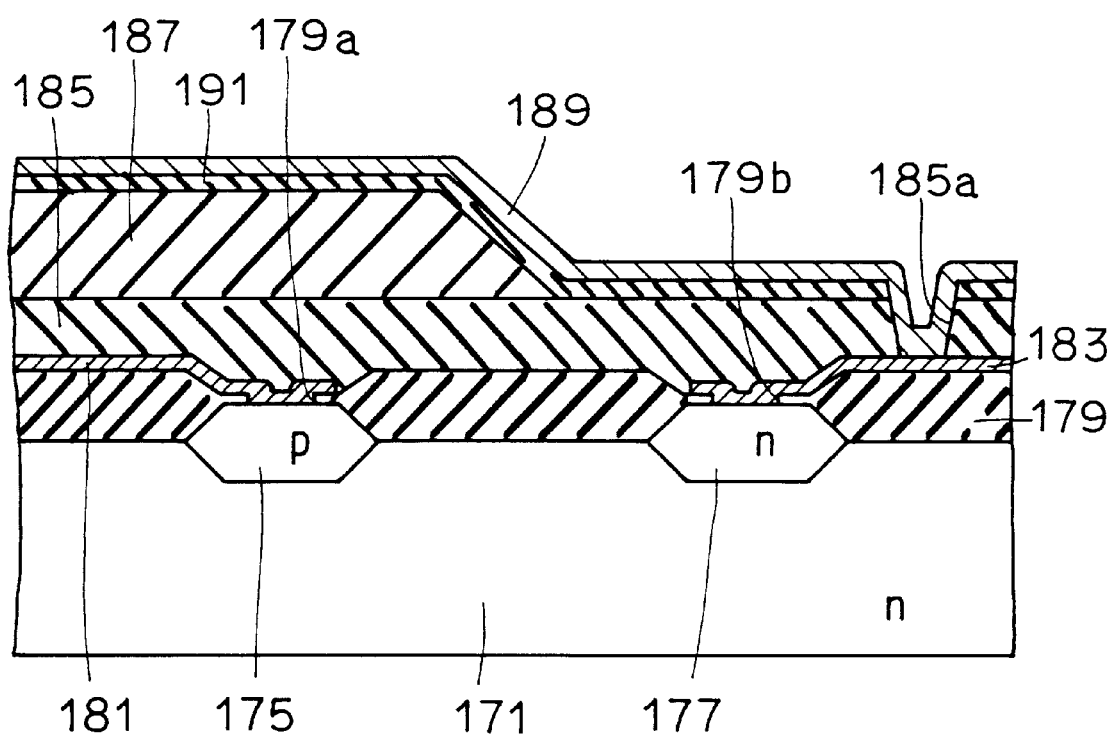
FIG. 16 is a schematic cross section showing a structure of a semiconductor device according to a ninth embodiment of the present invention.

Referring to FIG. 16, the present embodiment is implemented by adding an inorganic type silicon oxide film 191 to the device of the sixth embodiment shown in FIG. 13.

Particularly, inorganic type silicon oxide film 191 is formed such that it would be positioned between an organic type silicon oxide film 187 and a third interconnection layer 189, and between an inorganic type silicon oxide film 185 and third interconnection layer 189. The provision of this inorganic type silicon oxide film 191 leads to an improvement of the adhesiveness between third interconnection layer 189 and organic type silicon oxide film 187.

Embodiment 10

Figure 17:
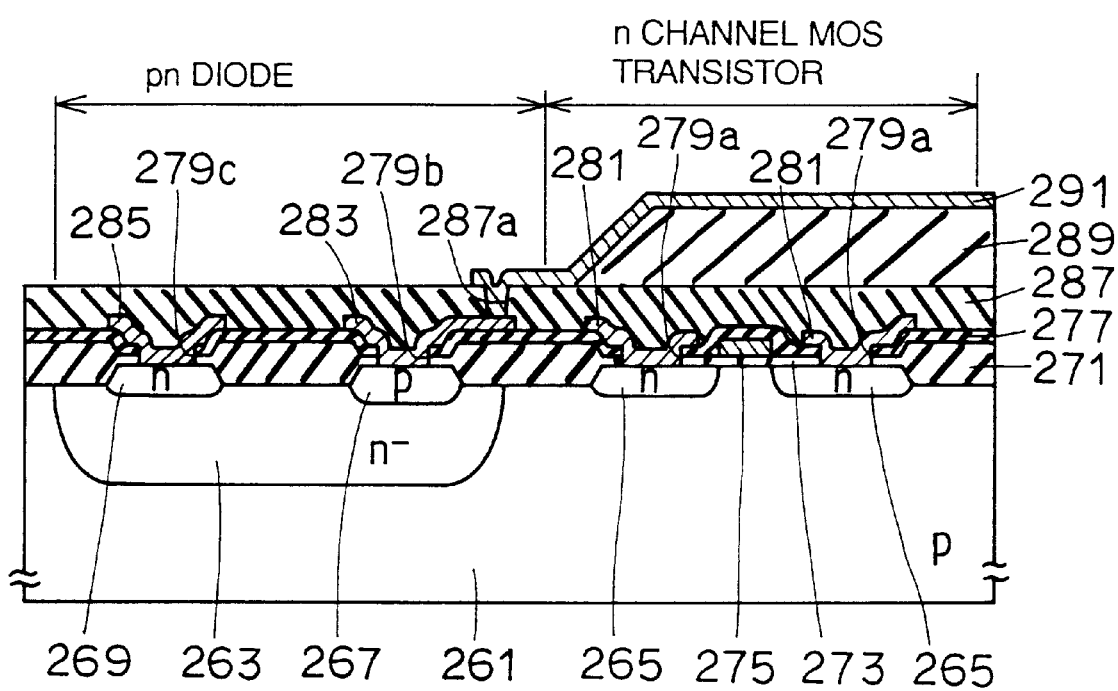
FIG. 17 is a schematic cross section showing a structure of a semiconductor device according to a tenth embodiment of the present invention.
Figure 18A:
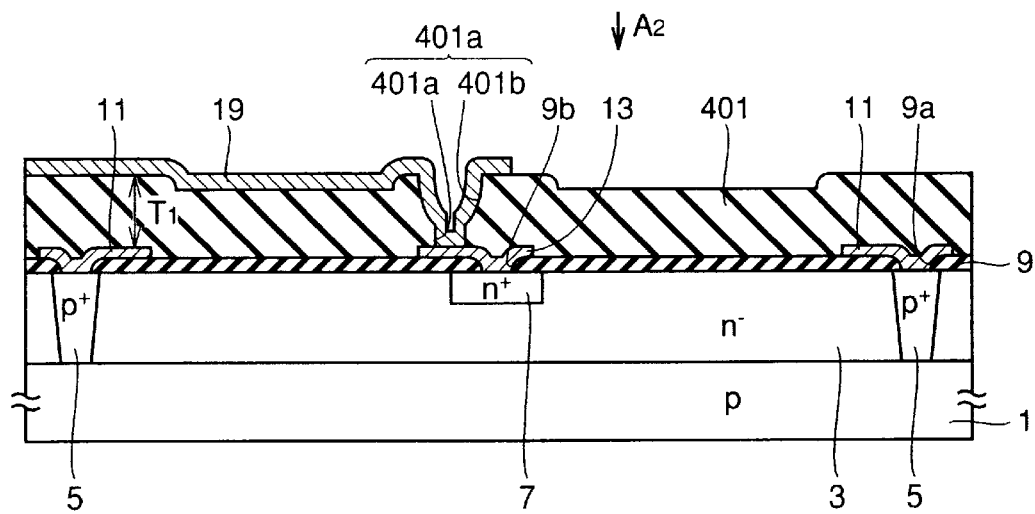
FIG. 18A is a schematic cross section showing a structure of a conventional semiconductor device.
Figure 18B:
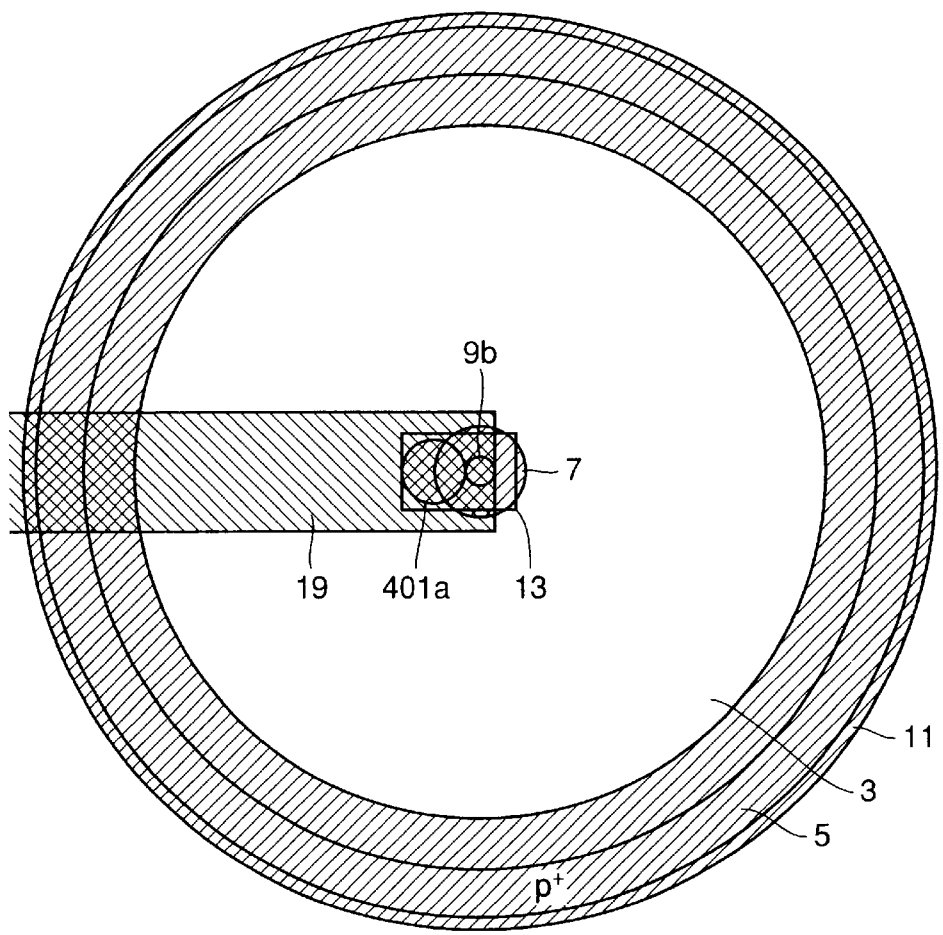
FIG. 18B is a schematic plan view taken from the direction of arrow $A_2$ in FIG. 18A.
Figure 19:
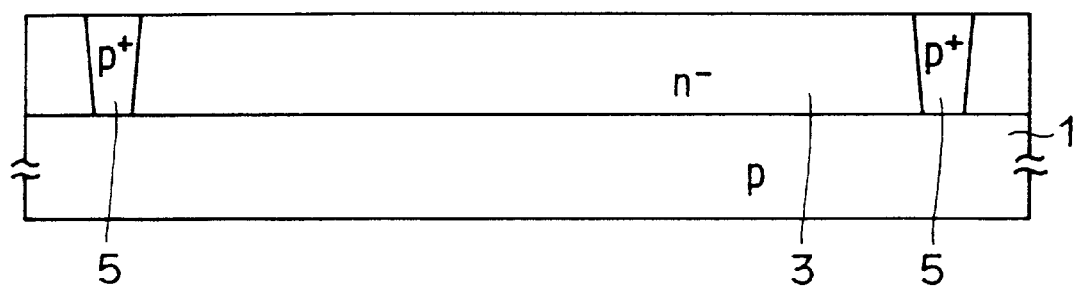
FIGS. 19 to 25 are schematic cross sections illustrating a method of manufacturing the conventional semiconductor device, presented in the order of the steps which are to be performed.
Figure 20:
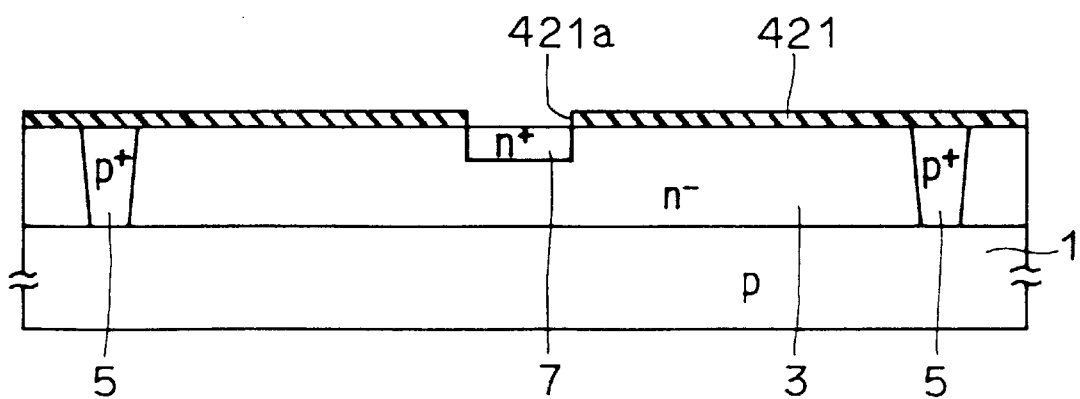
Figure 21:
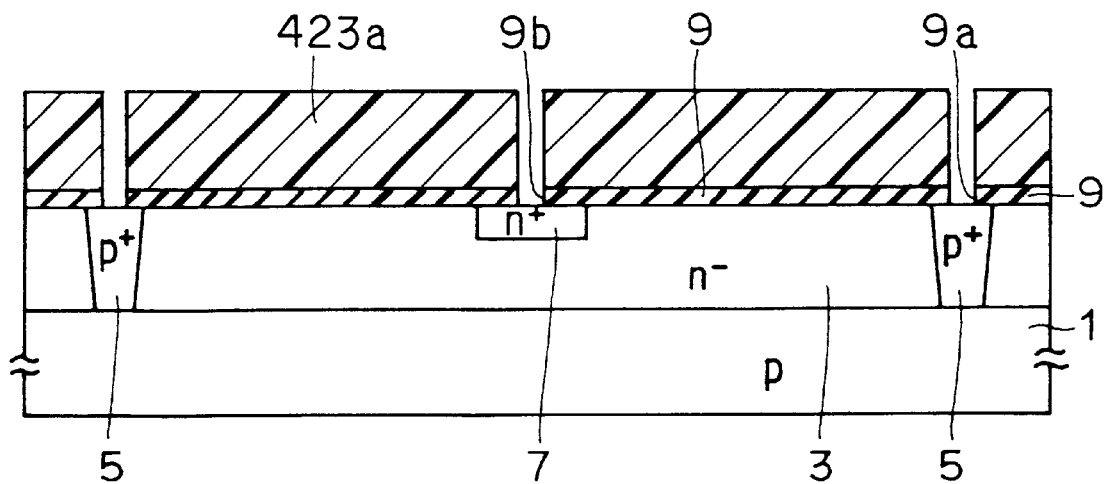
Figure 22:
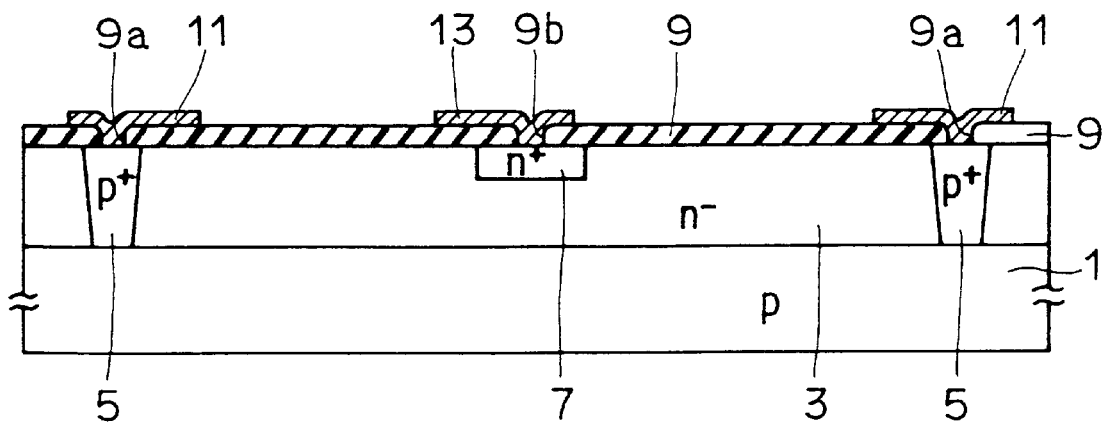
Figure 23:
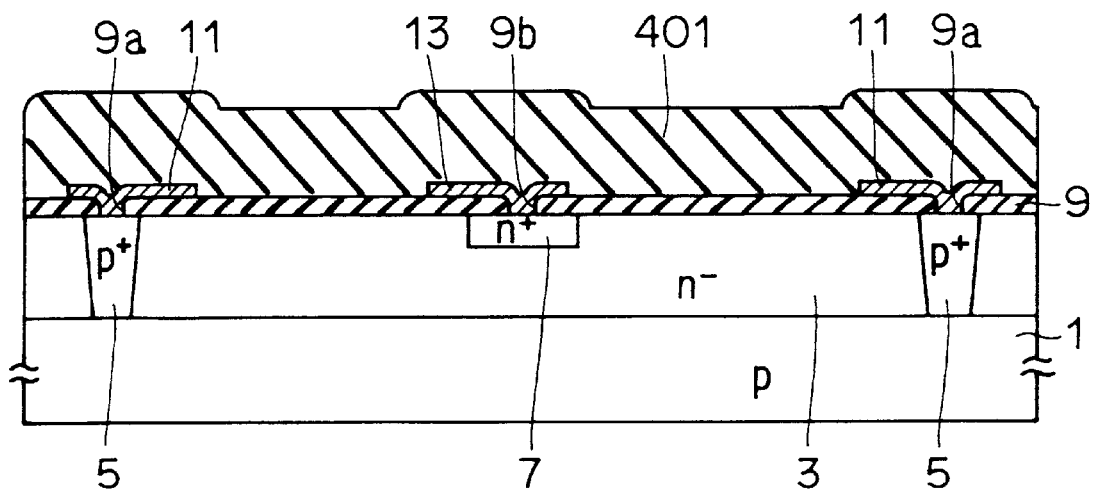
Figure 24:
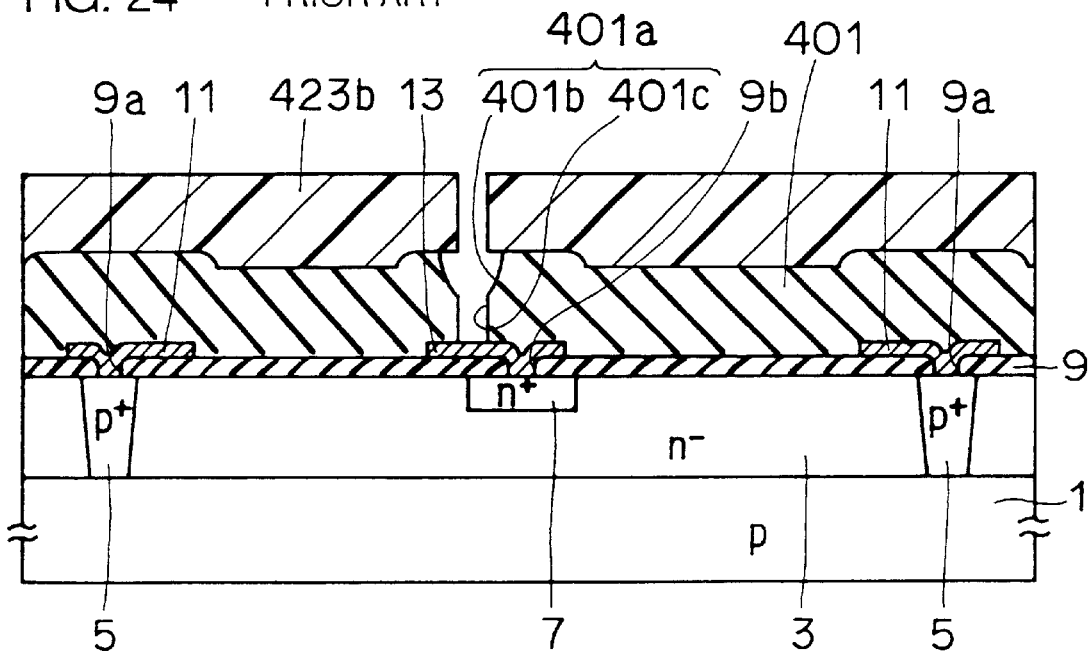
Figure 25:
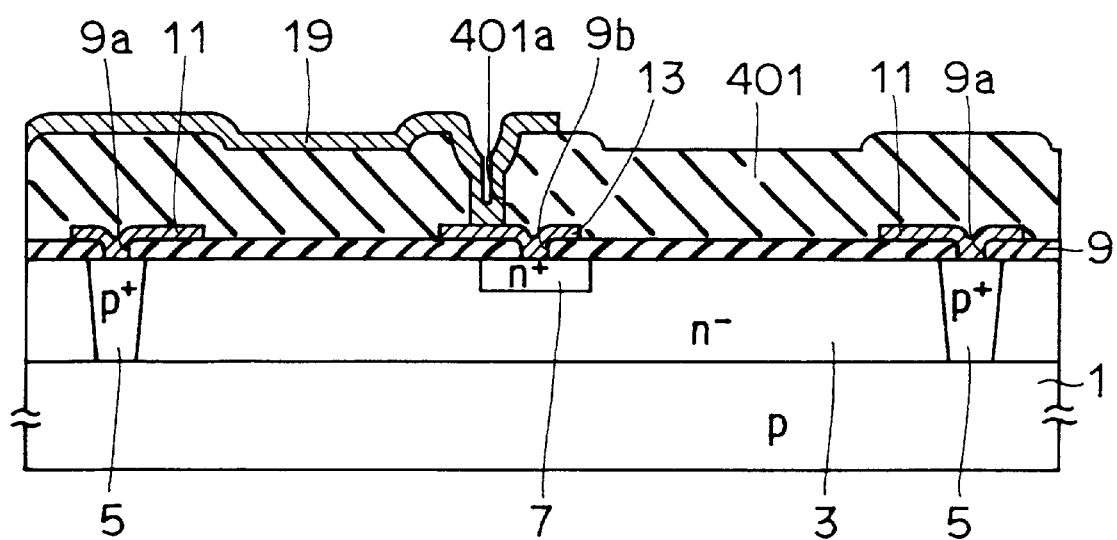
Figure 26:
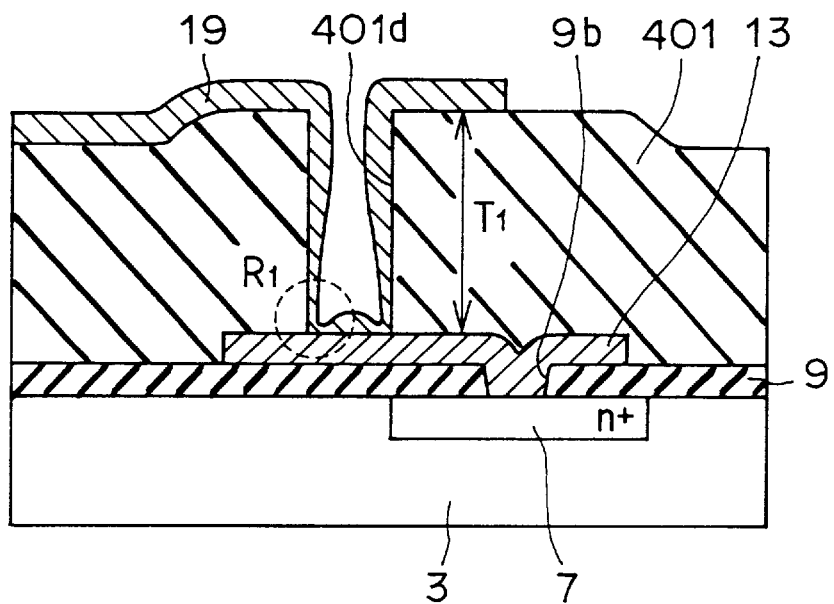
FIG. 26 is a cross sectional view illustrating disadvantages experienced when a through hole is formed only by anisotropic etching.
Figure 27:
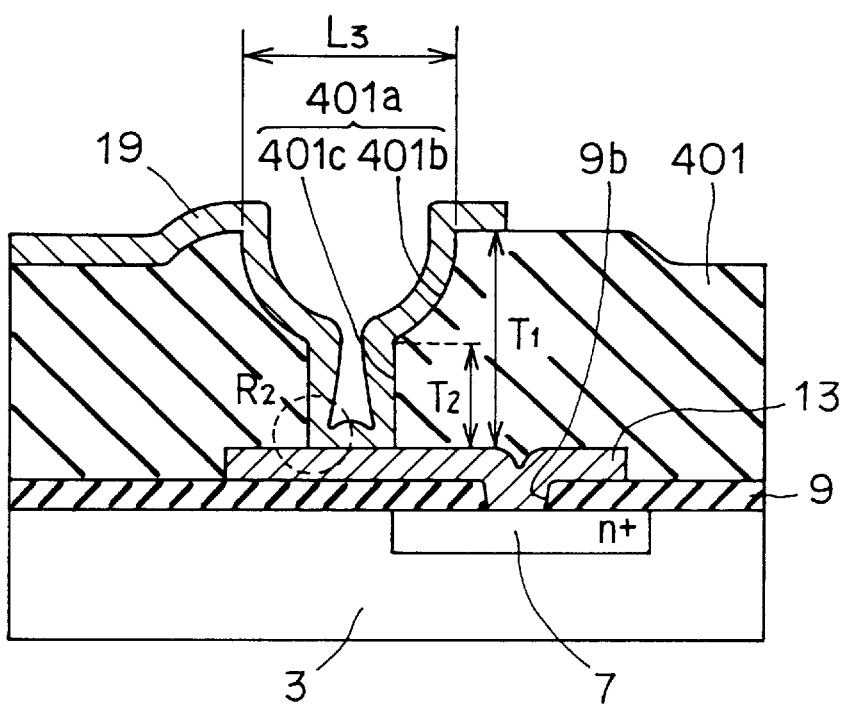
FIG. 27 is a schematic cross section showing how a through hole may be formed by isotropic etching and anisotropic etching.
Figure 28:
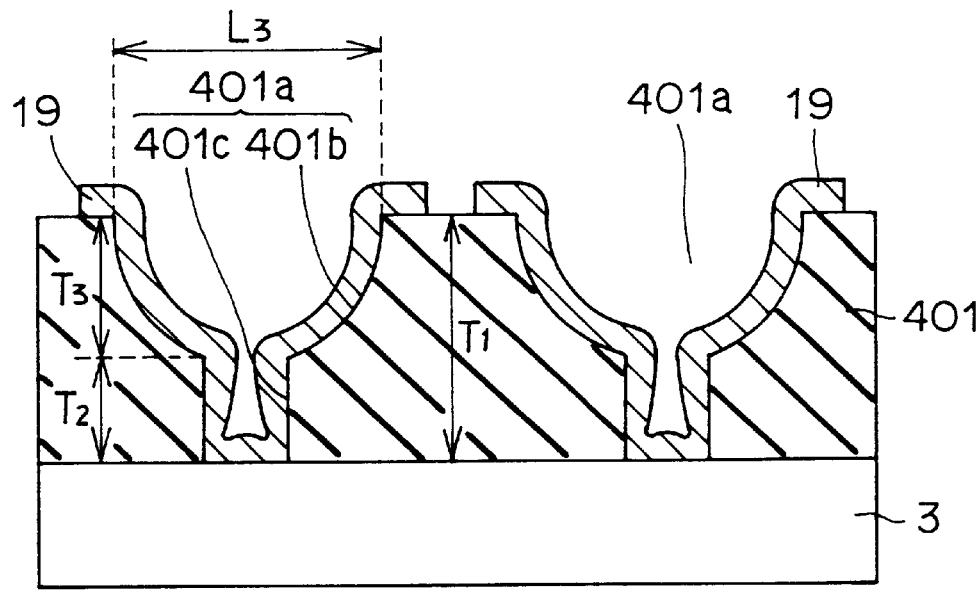
FIG. 28 is a schematic cross section showing how the through holes may be formed adjacent to one another.
Figure 29:
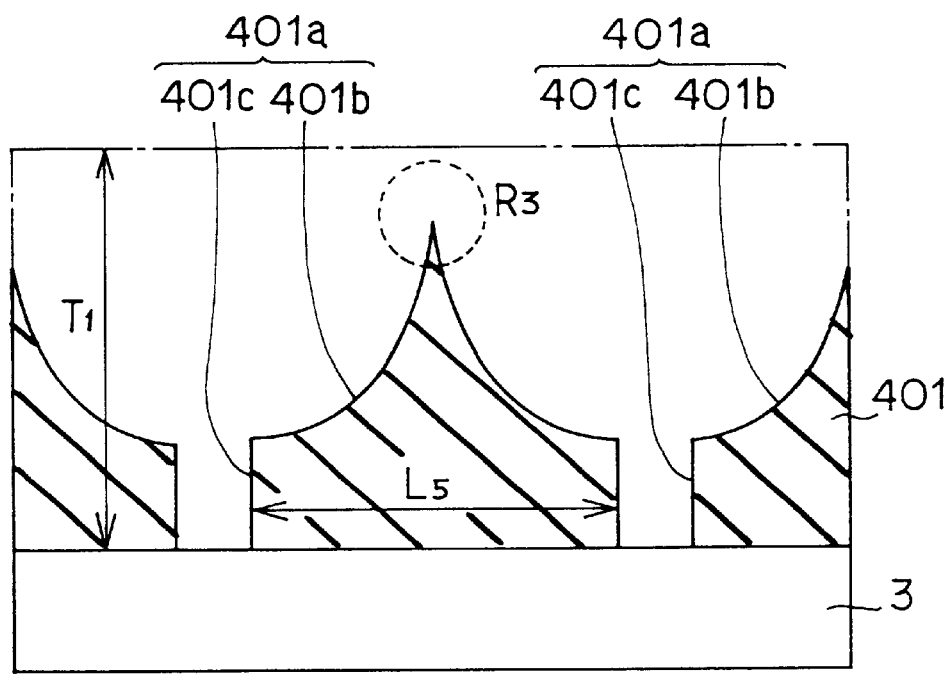
FIG. 29 is a schematic cross section illustrating disadvantages experienced when the film thickness of the interlayer insulating film is increased.

Referring to FIG. 17, the semiconductor device of the present embodiment is an example of specific application of the semiconductor device in accordance with the sixth embodiment shown in FIG. 13. That is, the sixth embodiment shown in FIG. 13 is employed in a device with a pn diode and an n channel MOS transistor formed on a same substrate.

First, at the pn diode region, an n type diffused region 263 is formed at a surface of a p type semiconductor substrate 261. An element isolating oxide film 271 is also formed at the surface of p type semiconductor substrate 261. At the surface of n type diffused region 263 which is isolated by this element isolating oxide film 271, a p type diffused region 267 and an n type diffused region 269 are formed, respectively. In addition, a thin silicon oxide film 277 is formed on the surface of element isolating oxide film 271.

At this thin silicon oxide film 277, a contact hole 279b reaching a portion of the surface of p type diffused region 267 and a contact hole 279c reaching a portion of a surface of n type diffused region 269 are formed. Second and third electrode layers 283 and 285 are formed such that they would be in contact with p type diffused region 267 and n type diffused region 269 respectively, through these contact holes 279b and 279c, respectively.

In the n channel MOS transistor region, element isolating oxide film 271 is formed at the surface of p type semiconductor substrate 261. At the surface of p type semiconductor substrate 261 which is isolated by this element isolating oxide film 271, n type diffused regions 265 which are to be a pair of source/drain regions are formed, with a predetermined distance between them. At a region between this pair of n type diffused regions 265, a gate electrode 275 is formed, with a gate oxide film 273 therebetween. Thin silicon oxide film 277 is formed so as to cover this gate electrode 275. In thin silicon oxide film 277, contact holes 279a are formed, exposing portions of surfaces of the pair of n type diffused regions 265. Each first electrode 281 is formed such that it would be in contact with each of the pair of n type diffused region 265 through each contact hole 279a.

At pn diode region and n channel MOS transistor region, an inorganic type silicon oxide film 287 is formed so as to cover first, second, and third electrode layers 281, 283, and 285. On the surface of inorganic type silicon oxide film 287 above n channel MOS transistor, an organic type silicon oxide film 289 is formed. This organic type silicon oxide film 289 is formed, for example, of polyphenylsilsesquioxane. At a region of inorganic type silicon oxide film 287 where organic type silicon oxide film 289 is not formed, a through hole 287a is formed, reaching a portion of the surface of second electrode layer 283.

An interconnection layer 291 of AlSi is formed such that it would be in contact with second electrode layer 283 via this through hole 287a, and that it would be spaced apart from first electrode layer 281 with inorganic type and organic type silicon oxide films 287 and 289 therebetween.

When the sixth embodiment shown in FIG. 13 is applied to such a structure, the effects as obtained in the sixth embodiment can also be obtained.

Furthermore, silicon type polymer, silicon type resin, or fluorine type resin can also be used as an organic type silicon oxide film in the first to tenth embodiments. In addition, not only organic type silicon oxide film but other kind of films can also be used as long as it contains an organic type material and has a breakdown voltage which is higher than that of an inorganic type silicon oxide film.

In addition, although AlSi has been described as a material for an interconnection layer in the first to tenth embodiments, it is not intended to be limitative. In particular, it may also be Al, polycrystalline silicon in which an impurity is implanted, or refractory metal.

Based on the foregoing, in the semiconductor device in accordance with the present invention, enlargement of the opening of the through hole can be prevented. Accordingly, openings of the through holes being connected when two through holes are formed adjacent to each other, is prevented. Therefore, patterning of an interconnection layer connected to a conductive layer therebelow via the through hole is made easier. As a result, a satisfactory breakdown voltage can be obtained without increasing the chip size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a semiconductor substrate having a main surface;
a first conductive layer extending entirely above the main surface of the semiconductor substrate;
a second conductive layer extending entirely above the main surface of the semiconductor substrate, which second conductive layer is different from said first conductive layer, said first and second conductive layers being structurally situated at the same level with respect to the main surface of the semiconductor substrate, wherein said second conductive layer comprises a sidewall and said first conductive layer continuously surrounds the sidewall of the second conductive layer;
an insulating layer formed on said first and second conductive layers, said insulating layer having an upper surface and a hole therethrough from the upper surface to a surface of said second conductive layer; and
a third conductive layer formed on said insulating layer in direct contact with said second conductive layer through said hole and spaced apart from said first conductive layer with said insulating layer therebetween; wherein,
a thickness of said insulating layer at a region surrounding said hole from the upper surface of the insulating layer to the surface of the second conductive layer is less than a thickness of insulating material separating said first and third conductive layers from each other.

2. The semiconductor device according to claim 1, wherein said insulating layer comprises a first insulating layer of an inorganic material and a second insulating layer including an organic material, and includes said first insulating layer at a region surrounding said hole and includes said first insulating layer and said second insulating layer formed on said first insulating layer at a region where said first and third conductive layers are separated from one another.

3. The semiconductor device according to claim 2, wherein said first insulating layer includes a silicon oxide film; and
said second insulating layer is of a layer including polyphenylsilsesquioxane.

4. The semiconductor device according to claim 1, further comprising a semiconductor substrate, a first impurity region, and a second impurity region; wherein
said semiconductor substrate has a main surface;
said first and second impurity regions are formed on the main surface of said semiconductor substrate, being isolated from each other;
said first conductive layer is in contact with a surface of said first impurity region and said second conductive layer is in contact with a surface of said second impurity region.

5. The semiconductor device according to claim 1, wherein
said insulating layer further has a third insulating layer of an inorganic material; and
said third insulating layer is formed between said third conductive layer and said second insulating layer.

6. The semiconductor device according to claim 1, wherein
said first conductive layer, said second conducive layer, and said third conductive layer is formed of a material selected from the group consisting of aluminum (Al), aluminum silicon (AlSi), a polycrystalline silicon in which an impurity is introduced, and a refractory metal.

7. The semiconductor device according to claim 1, wherein the first and second conductive layers are electrically connected to a high breakdown voltage device.

8. The semiconductor device according to claim 1, wherein said insulating layer comprises a first insulating film of an inorganic type silicon oxide film and a second insulating film including an organic type silicon oxide film.

* * * * *